(12) United States Patent
Kim et al.

(10) Patent No.: US 11,770,961 B2
(45) Date of Patent: Sep. 26, 2023

(54) ELECTRONIC DEVICE WITH UPLINK SIGNAL TO FIRST AREA IN A FIRST MODE

(71) Applicant: Samsung Display Co., Ltd., Yongin-si (KR)

(72) Inventors: Jinwoo Kim, Hwaseong-si (KR); JIna Kang, Hwaseong-si (KR); Kyowon Ku, Seoul (KR); Soongyu Lee, Seoul (KR); Jeongheon Lee, Yongin-si (KR); Byeongkyu Jeon, Busan (KR); Chung-Won Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/207,489

(22) Filed: Mar. 19, 2021

(65) Prior Publication Data

US 2022/0052124 A1 Feb. 17, 2022

(30) Foreign Application Priority Data

Aug. 14, 2020 (KR) ........................ 10-2020-0102796

(51) Int. Cl.
*G06F 3/044* (2006.01)
*H10K 59/40* (2023.01)
*G06F 3/041* (2006.01)
*G06F 3/0354* (2013.01)

(52) U.S. Cl.
CPC ......... *H10K 59/40* (2023.02); *G06F 3/03545* (2013.01); *G06F 3/0412* (2013.01); *G06F 3/0416* (2013.01); *G06F 3/0445* (2019.05); *G06F 3/041662* (2019.05)

(58) Field of Classification Search
CPC .. G06F 3/03545; G06F 3/0412; G06F 3/0416; G06F 3/041662; G06F 3/0445
See application file for complete search history.

(56) References Cited

U.S. PATENT DOCUMENTS

| | | | |
|---|---|---|---|
| 9,939,975 B2 | 4/2018 | Ye et al. | |
| 10,379,694 B2 | 8/2019 | Park et al. | |
| 10,444,870 B2 | 10/2019 | Kadowaki et al. | |
| 10,795,483 B2 | 10/2020 | Hwang et al. | |
| 2021/0333975 A1* | 10/2021 | Miyamoto | G06F 3/03545 |
| 2021/0397297 A1* | 12/2021 | Ding | G06F 3/0443 |
| 2022/0027010 A1* | 1/2022 | Yuan | G06F 3/0442 |

FOREIGN PATENT DOCUMENTS

| | | |
|---|---|---|
| KR | 10-2016-0025443 A | 3/2016 |
| KR | 10-2020-0009800 A | 1/2020 |

* cited by examiner

*Primary Examiner* — Liliana Cerullo
(74) *Attorney, Agent, or Firm* — Lewis Roca Rothgerber Christie LLP

(57) ABSTRACT

An electronic device includes: a display layer; a sensor layer on the display layer and having an active area and a peripheral area adjacent to the active area, wherein the sensor layer is configured to operate in a first mode, in which a first input by an input device is sensed, and a second mode, in which a second input by touch is sensed; and a controller configured to control the sensor layer, wherein, in the first mode, the controller is configured to define the active area into a first area and a second area different from the first area, which are defined based on a coordinate at which the first input is sensed, and in the first mode, the controller is configured to provide an uplink signal to the first area and provide a reverse-phase signal having a reverse phase of the uplink signal to the second area.

12 Claims, 18 Drawing Sheets

ELECTRONIC DEVICE WITH UPLINK SIGNAL TO FIRST AREA IN A FIRST MODE

CROSS-REFERENCE TO RELATED APPLICATIONS

The present application claims priority to and the benefit of Korean Patent Application No. 10-2020-0102796, filed on Aug. 14, 2020, the entire content of which is incorporated herein by reference.

BACKGROUND

Aspects of some example embodiments of the present disclosure herein relate to an electric device having relatively improved sensing reliability and image quality.

Electronic devices may sense an external input applied from the outside of the electronic devices. The external input may be a user's input. The user's input may include various types of external inputs such as a portion of user's body (e.g., a user's finger or touch input), light, heat, a pen, a pressure, or the like. The electronic devices may recognize coordinates of the pen using an electromagnetic resonance (EMR) method or may recognize the coordinates of the pen using an active electrostatic (AES) method.

The above information disclosed in this Background section is only for enhancement of understanding of the background and therefore the information discussed in this Background section does not necessarily constitute prior art.

SUMMARY

Aspects of some example embodiments of the present disclosure include an electric device having relatively improved sensing reliability and image quality.

According to some example embodiments of the inventive concept, an electronic device includes: a display layer; a sensor layer, which is on the display layer, on which an active area and a peripheral area adjacent to the active area are defined, and which operates in a first mode, in which a first input by an input device is sensed, and a second mode, in which a second input by touch is sensed; and a controller configured to control the sensor layer, wherein, in the first mode, the controller is configured to define the active area into a first area and a second area different from the first area, which are defined based on a coordinate at which the first input is sensed, and in the first mode, the controller is configured to provide an uplink signal to the first area and provide a reverse-phase signal having a reverse phase of the uplink signal to the second area.

According to some embodiments, the first mode may include a first section in which the uplink signal or the reverse-phase signal is transmitted to the sensor layer and a second section in which the first input is sensed from a downlink signal provided from the input device, and the second section may proceed after the first section.

According to some embodiments, the first area may be adjacent to the second area.

According to some embodiments, the first area may be spaced apart from the second area.

According to some embodiments, the second area may be provided in plurality, and the plurality of second areas may be spaced apart from each other with the first area therebetween.

According to some embodiments, the first area may have an area different from that of the second area.

According to some embodiments, the uplink signal may have an intensity different from that of the reverse-phase signal.

According to some embodiments, the coordinate may overlap the first area.

According to some embodiments, the second area may not overlap the first area.

According to some embodiments, the display layer may include a light emitting element, the light emitting element may include a first electrode, a second electrode on the first electrode, and an emission layer between the first electrode and the second electrode, and the uplink signal and the reverse-phase signal may be offset from each other in the second electrode.

According to some embodiments, the sensor layer may include a cross electrode that insulately crosses the electrode, the sensor layer may be configured to sense the first input through a change in capacitance generated between the electrode and the cross electrode in the second mode, and the sensor layer may be configured to sense a second input through a change in mutual capacitance generated between the electrode and the cross electrode in the second mode.

According to some embodiments, the first mode and the second mode may be repeated with each other, and in a (2n−1)-th second mode (where n is a positive integer), the controller may be configured to provide the uplink signal, and in a 2n-th second mode, the controller may be configured to provide the reverse-phase signal.

According to some embodiments, in the second mode, the controller may be configured to define the active area into a third area and a fourth area adjacent to the third area, and in the second mode, the controller may be configured to provide the uplink signal to the third area and provide the reverse-phase signal to the fourth area.

According to some embodiments, the second mode may include a first section in which the uplink signal or the reverse-phase signal is transmitted to the sensor layer and a second section in which the second input is sensed, and the second section may proceed after the first section.

According to some embodiments of the inventive concept, an electronic device includes: a display layer; a sensor layer on the display layer and including an electrode and a cross electrode that insulately crosses the electrode; and a controller by which the sensor layer operates in a first mode, in which a first input is sensed through a change in capacitance between the electrode and the cross electrode or a second mode, in which a second input is sensed through a change in mutual capacitance generated between the electrode and the cross electrode, wherein the controller is configured to provide an uplink signal to a first area into which the first input is sensed and provide a reverse-phase signal having a reverse phase of the uplink signal to a second area that does not overlap the first area.

According to some embodiments, the first area may be adjacent to the second area.

According to some embodiments, the first area may be spaced apart from the second area.

According to some embodiments, the second area may be provided in plurality, and the plurality of second areas may be spaced apart from each other with the first area therebetween.

According to some embodiments, the first area may have an area different from that of the second area.

According to some embodiments, the uplink signal may have an intensity different from that of the reverse-phase signal.

BRIEF DESCRIPTION OF THE FIGURES

The accompanying drawings are included to provide a further understanding of embodiments according to the inventive concept, and are incorporated in and constitute a part of this specification. The drawings illustrate aspects of some example embodiments of the inventive concept and, together with the description, serve to explain principles of the inventive concept. In the drawings.

DETAILED DESCRIPTION

Figure 1:
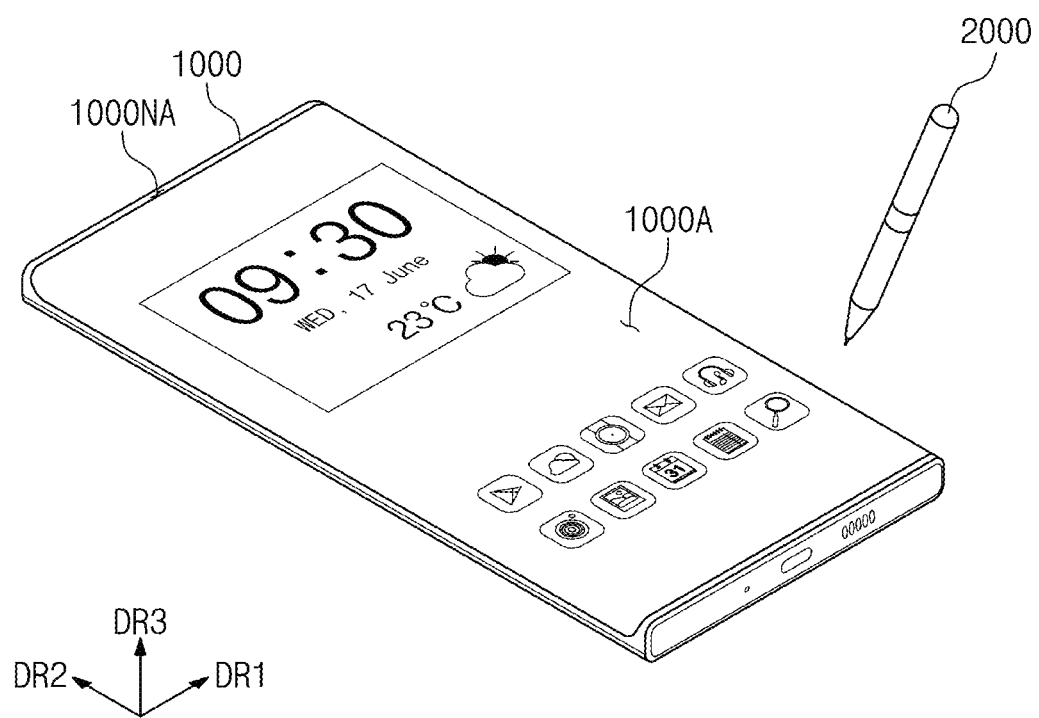
FIGS. 1 and 2 are perspective views of an electronic device and an input device according to some embodiments of the inventive concept.

In this specification, it will also be understood that when one component (or region, layer, portion) is referred to as being "on", "connected to", or "coupled to" another component, it can be directly located/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element according to some embodiments can be referred to as a second element according to some embodiments without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, aspects of some example embodiments of the inventive concept will be described in more detail with reference to the accompanying drawings.

FIG. 1 is a perspective view of an electronic device and an input device according to some embodiments of the inventive concept.

Referring to FIG. 1, an electronic device 1000 may be a device that is activated according to an electrical signal. For example, the electronic device 1000 may be a mobile phone, a tablet PC, a car navigation system, a game console, or a wearable device, but is not limited thereto. FIG. 1 illustrates an example in which the electronic device 1000 is provided as the mobile phone.

An active area 1000A and a peripheral area 1000NA may be defined on the electronic device 1000. The electronic device 1000 may display images at the active area 1000A. The active area 1000A may include a surface (e.g., a planar display surface) defined by a first direction DR1 and a second direction DR2. The peripheral area 1000NA may surround the active area 1000A.

A thickness direction of the electronic device 1000 may be parallel to a third direction DR3 crossing the first direction DR1 and the second direction DR2 (e.g., in a direction perpendicular or normal with respect to the plane defined by the first direction DR1 and the second direction DR2). Thus, a front surface (or top surface) and a rear surface (or bottom surface) of each of members constituting the electronic device 1000 may be defined based on the third direction DR3.

An electronic device 1000 may sense inputs applied from the outside thereof. The external inputs may include various types of external inputs such as a portion of the user's body (e.g., a user's finger or touch input), light, heat, or a pressure. The external inputs may be referred to as second inputs.

The electronic device 1000 illustrated in FIG. 1 may sense an input by a user's touch and an input by an input device 2000. The input device 2000 may refer to a device other than the user's body. An input by the input device 2000 may be referred to as a first input. For example, the input device 2000 may be an active pen, a stylus pen, a touch pen, or an electronic pen. Hereinafter, a case in which the input device 2000 is the active pen will be described as an example.

The electronic device 1000 and the input device 2000 may perform bidirectional communication. The electronic device 1000 may provide an uplink signal to the input device 2000. For example, the uplink signal may include a synchronization signal or information of the electronic device 1000, but embodiments according to the present disclosure are not particularly limited thereto. The input device 2000 may provide a downlink signal to the electronic device 1000. The downlink signal may include a synchronization signal or state information of the input device 2000. For example, the downlink signal includes coordinate information of the input device 2000, battery information of the input device 2000, inclination information of the input device 2000, and/or various information stored in the input device 2000, but embodiments according to the present disclosure are not particularly limited thereto. The uplink signal and the downlink signal will be described later.

Figure 2:
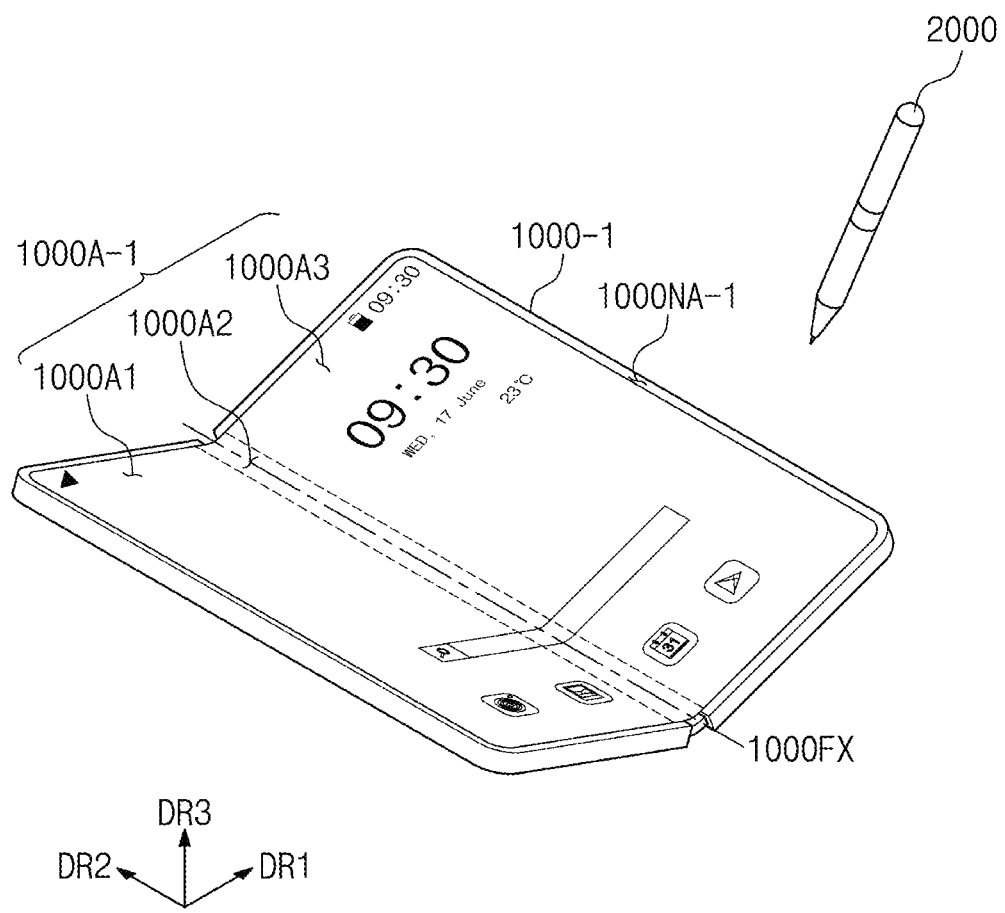

FIG. 2 is a perspective view of the electronic device and the input device according to some embodiments of the inventive concept. In describing FIG. 2, the same reference numerals are used for the components described through FIG. 1, and descriptions thereof will be omitted.

Referring to FIG. 2, a display device 1000-1 may display an image through an active area 1000A-1. FIG. 2 illustrates a state in which the electronic device 1000-1 is folded at an angle (e.g., at a set or predetermined angle). In the state in which the electronic device 1000 is unfolded, the active area 1000A-1 may include a plane defined by a first direction DR1 and a second direction DR2.

The active area 1000A-1 may include a first area 1000A1, a second area 1000A2, and a third area 1000A3. The first area 1000A1, the second area 1000A2, and the third area 1000A3 may be sequentially defined in the first direction DR1. The second area 1000A2 may be bent with respect to a folding axis 1000FX extending along the second direction DR2. Thus, the first area 1000A1 and the third area 1000A may be referred to as non-folding areas, and the second area 1000A2 may be referred to as a folding area.

When the electronic device 1000-1 is folded, the first area 1000A1 and the third area 1000A3 may face each other. Thus, in the fully folded state, the active area 1000A may not be exposed to the outside, which may be referred to as in-folding. However, this is merely an example, and thus, an operation of the electronic device 1000-1 is not limited thereto.

For example, according to some embodiments of the inventive concept, when the electronic device 1000-1 is folded, the first area 1000A1 and the third area 1000A3 may be opposite to each other. Thus, in the folded state, the active area 1000A-1 may be exposed to the outside, which may be referred to as out-folding.

The electronic device 1000-1 may perform only one operation of the in-folding and the out-folding. Alternatively, the electronic device 1000-1 may perform all the operations of the in-folding and the out-folding. In this case, the same area of the electronic device 1000-1, for example, the second area 1000A2 may be in-folded and out-folded.

FIG. 2 illustrates one folding area and two non-folding areas as an example, but the number of folding and non-folding areas is not limited thereto. For example, the electronic device 1000-1 may include more than two folding areas, i.e., a plurality of non-folding areas and a plurality of folding areas located between the non-folding areas adjacent to each other.

FIG. 2 illustrates that the folding shaft 1000FX extends in the second direction DR2 as an example, but the embodiments according to the inventive concept are not limited thereto. For example, the folding axis FX may extend in a direction parallel to the first direction DR1. In this case, the first area 1000A1, the second area 1000A2, and the third area 1000A3 may be sequentially arranged along the second direction DR2.

The active area 1000A-1 may overlap at least one electronic module. For example, the electronic modules may include a camera module and a proximity illuminance sensor. The electronic modules may receive an external input transmitted through the active area 1000A-1 or may provide an output through the active area 1000A-1. A portion of the active area 1000A-1 overlapping the camera module and the proximity illuminance sensor may have a transmittance greater than that of the other portion of the active area 1000A-1. Thus, an area, on which the plurality of electronic modules are located, may not be provided to a peripheral area 1000NA-1 around the active area 1000A-1. As a result, an area ratio of the active area 1000A-1 to the front surface of the electronic device 1000-1 may increase.

The electronic device 1000-1 and the input device 2000 may perform bidirectional communication. The electronic device 1000-1 may provide an uplink signal to the input device 2000. The input device 2000 may provide a downlink signal to the electronic device 1000-1. The electronic device 1000-1 may sense coordinates of the input device 2000 by using a signal provided from the input device 2000.

Figure 3:
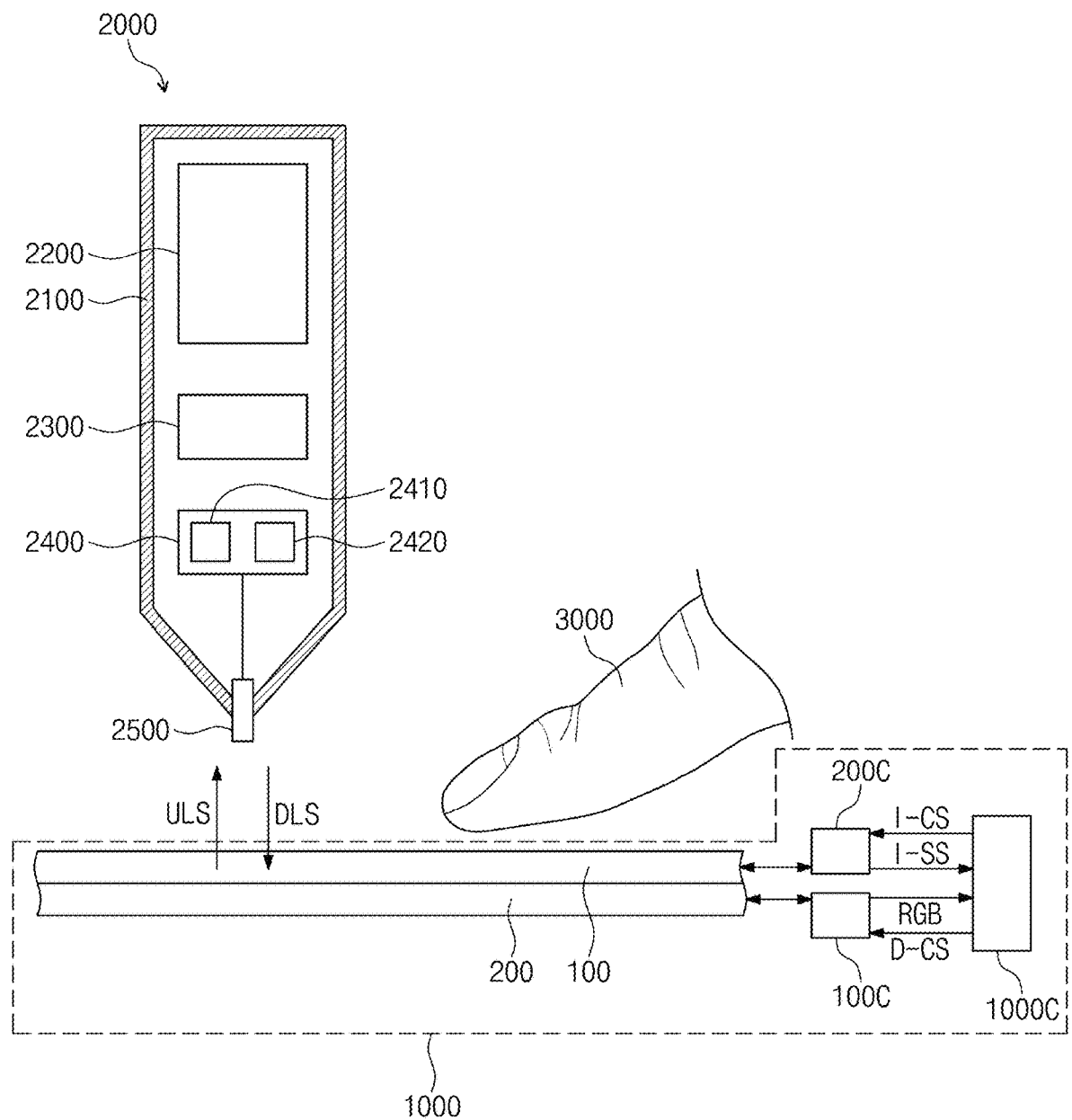
FIG. 3 is a schematic block diagram illustrating the electronic device and the input device according to some embodiments of the inventive concept.

FIG. 3 is a schematic block diagram illustrating the electronic device and the input device according to some embodiments of the inventive concept.

Referring to FIG. 3, the electronic device 1000 may include a display layer 100, a sensor layer 200, a display controller 100C, a sensor controller 200C, and a main controller 1000C.

The display layer 100 may be configured to substantially generate an image. The display layer 100 may be an emission-type display layer. For example, the display layer 100 may be an organic light emitting display layer, a quantum dot display layer, a micro LED display layer, or a nano LED display layer.

The sensor layer 200 may be located on the display layer 100. The sensor layer 200 may sense an external input applied from the outside. The sensor layer 200 may sense a first input by the input device 2000 and a second input by a user's body 3000.

The main controller 1000C may control an overall operation of the electronic device 1000. For example, the main controller 1000C may control operations of the display controller 100C and the sensor controller 200C. The main controller 1000C may include at least one microprocessor, and the main controller 1000C may be referred to as a host.

The display controller 100C may control the display layer 100. The main controller 1000C may further include a graphic controller. The display controller 100C may receive image data RGB and a control signal D-CS from the main controller 1000C. The control signal D-CS may include various signals. For example, the control signal D-CS may include an input vertical synchronization signal, an input horizontal synchronization signal, a main clock, and a data enable signal. The display controller 100C may generate a vertical synchronization signal and a horizontal synchronization signal for controlling timing of providing a signal to the display layer 100 based on the control signal D-CS.

The sensor controller 200C may control the sensor layer 200. The sensor controller 200C may receive a control signal I-CS from the main controller 1000C. The control signal I-CS may include a mode determination signal and a clock signal for determining a driving mode of the sensor controller 200C. The sensor controller 200C may operate in a first mode, in which the first input by the input device 2000 is sensed, and a second mode in which, the second input by the user's body 3000 is sensed, on the basis of the control signal I-CS. The sensor controller 200C may control the sensor layer 200 in the first mode or the second mode to be described later based on the mode determination signal.

The sensor controller 200C may calculate coordinate information of the first input or the second input based on the signal received from the sensor layer 200 and provide a coordinate signal I-SS having the coordinate information to the main controller 1000C. The main controller 1000C executes an operation corresponding to a user input based on the coordinate signal I-SS. For example, the main controller 1000C may operate the display controller 100C to display a new application image on the display layer 100 based on the coordinate signal I-SS.

The input device 2000 may include a housing 2100, a power source 2200, a controller 2300, a communication module 2400, and a pen electrode 2500. However, components constituting the input device 2000 are not limited to the components listed above. For example, the input device 2000 may further include an electrode switch for conversion to a signal transmission mode or a signal reception mode, a pressure sensor for sensing a pressure, a memory for storing information (e.g., set or predetermined information), a rotation sensor for sensing rotation, or the like.

The housing 2100 may have a pen shape, and an accommodation space may be defined in the housing 2100. The power source 2200, the controller 2300, the communication module 2400, and the pen electrode 2500 may be accommodated in an accommodation space defined inside the housing 2100.

The power source 2200 may supply power to the controller 2300 and the communication module 2400 inside the input device 2000. The power source 2200 may include a battery or a high-capacity capacitor.

The controller 2300 may control an operation of the input device 2000. The controller 2300 may be an application-specific integrated circuit (ASIC). The controller 2300 may be configured to operate according to a designed program.

The communication module 2400 may include a transmission circuit 2410 and a reception circuit 2420. The transmission circuit 2410 may output the downlink signal DLS to the sensor layer 200. The reception circuit 2420 may receive an uplink signal ULS provided from the sensor layer 200. The transmission circuit 2410 may receive a signal provided from the controller 2300 to modulate the signal to a signal that is capable of being sensed by the sensor layer 200, and the reception circuit 2420 may modulate the signal provided from the sensor layer 200 to a signal that is capable of being processed by the controller 2300.

The pen electrode 2500 may be electrically connected to the communication module 2400. A portion of the pen electrode 2500 may protrude from the housing 2100. Alternatively, the input device 2000 may further include a cover housing that covers the pen electrode 2500 exposed from the housing 2100. Alternatively, the pen electrode 2500 may be embedded in the housing 2100.

Figure 4A:
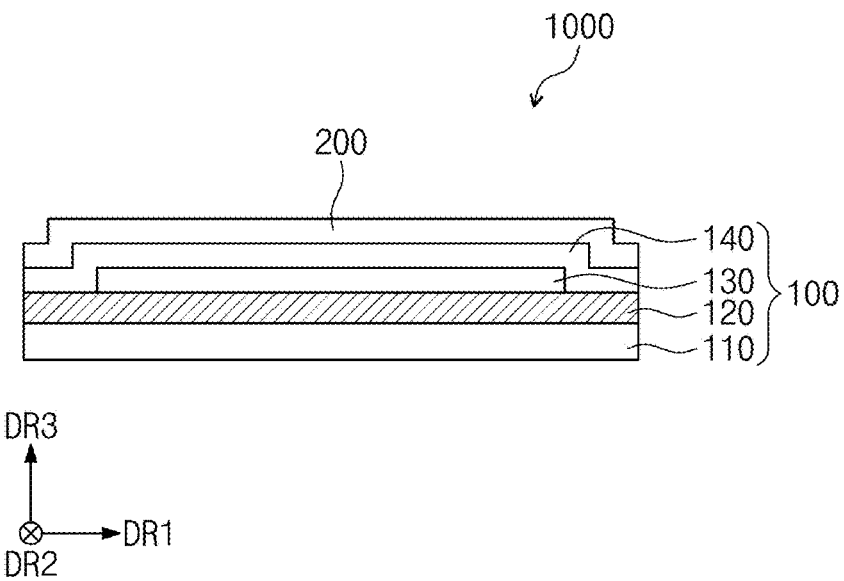
FIGS. 4A and 4B are cross-sectional views of the electronic device according to some embodiments of the inventive concept.

FIG. 4A is a cross-sectional view of the electronic device according to some embodiments of the inventive concept.

Referring to FIG. 4A, the electronic device 1000 may include a display layer 100 and a sensor layer 200. The display layer 100 may include a base layer 110, a circuit layer 120, a light emitting element layer 130, and an encapsulation layer 140.

The base layer 110 may be a member that provides a base surface on which a circuit layer 120 is located. The base layer 110 may be a glass substrate, a metal substrate, or a polymer substrate. However, the embodiments of the inventive concept are not limited thereto. For example, the base layer 110 may be an inorganic layer, an organic layer, or a composite layer.

The base layer 110 may have a multilayered structure. For example, the base layer 110 includes a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a base barrier layer.

Each of the first and second synthetic resin layers may include a polyimide-based resin. Also, each of the first and second synthetic resin layers may include at least one of an acrylate-based resin, a methacrylate-based resin, a polyisoprene-based resin, a vinyl-based resin, an epoxy-based resin, an urethane-based resin, a cellulose-based resin, a siloxane-based resin, a polyimide-based resin, or a perylene-based resin. In this specification, the "~~"-based resin means as including a functional group of "~~".

The circuit layer 120 may be located on the base layer 110. The circuit layer 120 may include an insulating layer, a semiconductor pattern, a conductive pattern, and a signal line. The insulating layer, the semiconductor layer, and the conductive layer may be formed on the base layer 110 in a manner such as coating or vapor deposition, and then, the insulating layer, the semiconductor layer, and the conductive layer may be selectively patterned through a plurality of photolithography processes. Thereafter, the semiconductor pattern, the conductive pattern, and the signal line included in the circuit layer 120 may be provided.

A light emitting element layer 130 may be located on the circuit layer 120. The light emitting element layer 130 may include a light emitting element. For example, the light emitting element layer 130 may include an organic light emitting material, quantum dots, quantum rods, a micro LED, or a nano LED.

An encapsulation layer 140 may be located on the light emitting element layer 130. The encapsulation layer 140 may protect the display element layer 130 against foreign substances such as moisture, oxygen, and dust particles.

The sensor layer 200 may be located on the display layer 100 through a continuous process. In this case, the sensor layer 200 may be expressed as being directly located on the display layer 100. The direct location may mean that a third component is not located between the sensor layer 200 and the display layer 100. That is, a separate adhesive member may not be located between the sensor layer 200 and the display layer 100. Alternatively, the sensor layer 200 may be bonded to the display layer 100 through an adhesive member. The adhesive member may include a common adhesive or an adhesive agent.

Figure 4B:
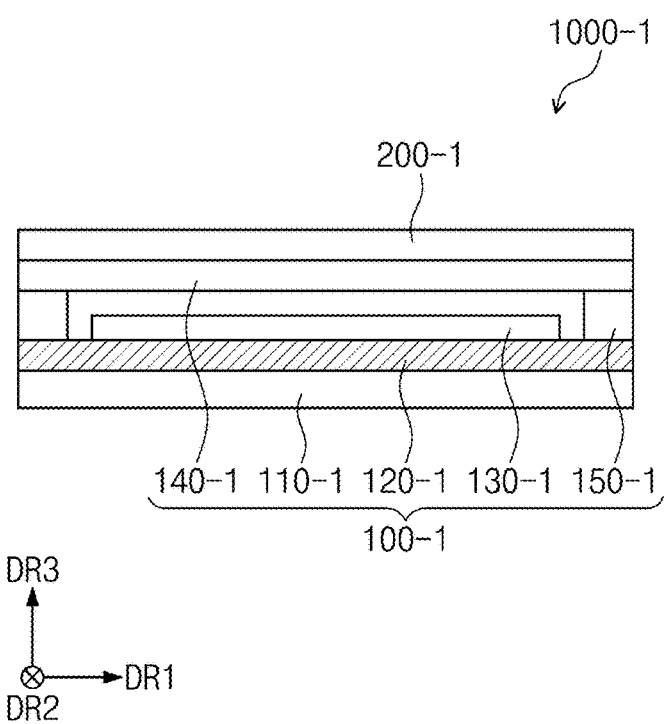

FIG. 4B is a cross-sectional view of the display module according to some embodiments of the inventive concept.

Referring to FIG. 4B, the electronic device 1000-1 may include a display layer 100-1 and a sensor layer 200-1. The display layer 100-1 may include a base substrate 110-1, a circuit layer 120-1, a light emitting element layer 130-1, an encapsulation substrate 140-1, and a coupling member 150-1.

Each of the base substrate 110-1 and the encapsulation substrate 140-1 may be a glass substrate, a metal substrate, or a polymer substrate, but is not particularly limited thereto.

The coupling member 150-1 may be located between the base substrate 110-1 and the encapsulation substrate 140-1. The coupling member 150-1 may couple the encapsulation substrate 140-1 to the base substrate 110-1 or the circuit layer 120-1. The coupling member 150-1 may include an inorganic material or an organic material. For example, the inorganic material may include a frit seal, and the organic material may include a photocurable resin or a photoplastic resin. However, the material forming the coupling member 150-1 is not limited to the above example.

The sensor layer 200-1 may be directly located on the encapsulation substrate 140-1. The direct location may mean that a third component is not located between the sensor layer 200-1 and the display layer 100-1. That is, a separate adhesive member may not be located between the sensor layer 200-1 and the display layer 100-1. However, the embodiments of the inventive concept are not limited thereto. For example, an adhesive layer may be further located between the sensor layer 200-1 and the encapsulation substrate 140-1.

Figure 5:
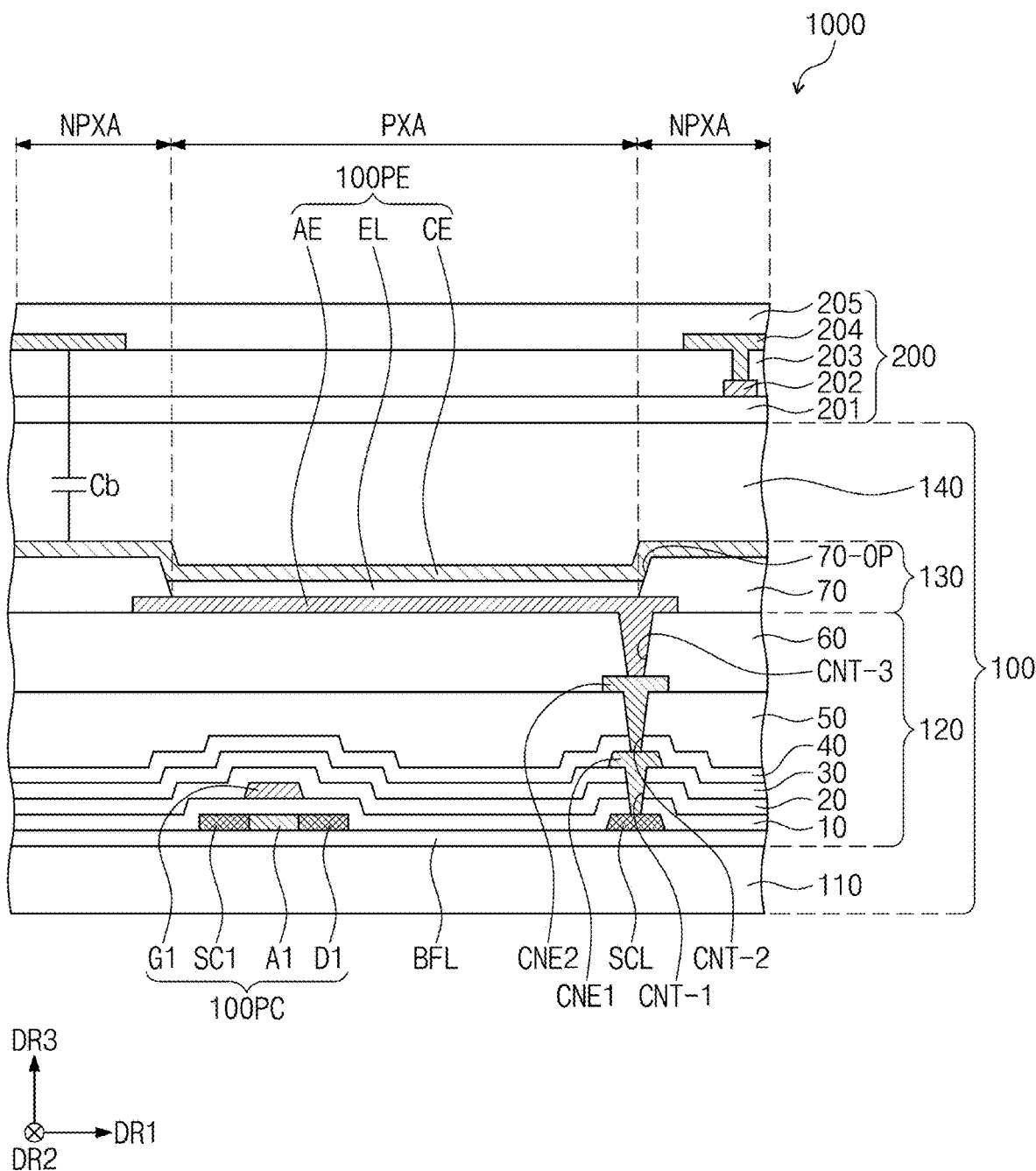
FIG. 5 is a cross-sectional view of a display module according to some embodiments of the inventive concept.

FIG. 5 is a cross-sectional view of the display module according to some embodiments of the inventive concept. In description in FIG. 5, the same reference numerals are used for components described in FIG. 4A, and some repetitive descriptions thereof may be omitted.

Referring to FIG. 5, at least one inorganic layer may be located on a top surface of the base layer 110. The inorganic layer may include at least one of aluminum oxide, titanium oxide, silicon oxide silicon oxynitride, zirconium oxide, or hafnium oxide. The inorganic layer may be provided as a multilayer. The multilayered inorganic layer may constitute a barrier layer and/or a buffer layer. In FIG. 5, the display layer 100 is illustrated as including a buffer layer BFL.

The buffer layer BFL may improve bonding force between the base layer 110 and the semiconductor pattern. The buffer layer BFL may include a silicon oxide layer and a silicon nitride layer, and the silicon oxide layer and the silicon nitride layer may be alternately laminated.

The semiconductor pattern may be located on the buffer layer BFL. The semiconductor pattern may include polysilicon. However, the embodiments of the inventive concept are not limited thereto. For example, the semiconductor pattern may include amorphous silicon, low-temperature polycrystalline silicon, or an oxide semiconductor.

FIG. 5 illustrates merely a portion of the semiconductor pattern. For example, the semiconductor pattern may be further located on other areas. The semiconductor pattern may be arranged in a specific rule over pixels. The semiconductor pattern has different electrical properties depending on whether the semiconductor pattern is doped. The semiconductor pattern may include a first region having high conductivity and a second region having low conductivity. The first area may be doped with an N-type dopant or a P-type dopant. A P-type transistor may include a doped region doped with the P-type dopant, and an N-type transistor may include a doped region doped with the N-type dopant. The second region may be a non-doped region or may be doped at a concentration less than that of the first area.

The first region may have conductivity greater than that of the second region and may substantially serve as an electrode or a signal line. The second region may substantially correspond to an active (or channel) of the transistor. That is to say, a portion of the semiconductor pattern may be an active of the transistor, another portion may be a source or drain of the transistor, and further another portion may be a connection electrode or a connection signal line.

Each of the pixels may have an equivalent circuit including seven transistors, one capacitor, and a light emitting element, and an equivalent circuit diagram of the pixel may be modified in various forms. In FIG. 5, one transistor 100PC and a light emitting element 100PE provided in the pixel are illustrated as an example for purposes of illustration, but embodiments are not limited thereto.

The transistor 100PC may include a source SC1, an active A1, a drain D1, and a gate G1. A source SC1, an active A1, and a drain D1 may be formed from the semiconductor pattern. The source SC1 and the drain D1 may extend in opposite directions from the active A1 on a cross-section. FIG. 5 illustrates a portion of a connection signal line SCL formed from the semiconductor pattern. According to some example embodiments, the connection signal line SCL may be connected to the drain D1 of the transistor 100PC on the plane.

A first insulating layer 10 may be located on the buffer layer BFL. The first insulating layer 10 commonly overlaps the plurality of pixels PX to cover the semiconductor pattern. The first insulating layer 10 may include an inorganic layer and/or an organic layer and have a single-layered or multilayered structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may include a single-layered silicon oxide layer. The insulating layer of the circuit layer 120, which will be described in more detail below, as well as the first insulating layer 10 may be an inorganic layer and/or an organic layer and may have a single-layered or a multilayered structure. The inorganic layer may include at least one of the above-described materials, but embodiments according to the present disclosure are not limited thereto.

The gate G1 is located on the first insulation layer 10. Each of the gate G1 may be a portion of a metal pattern. The gate G1 overlaps the active A1. In the process in which the semiconductor pattern is doped, the gate G1 may function as a mask.

The second insulating layer 20 may be located on the first insulating layer 10 to cover the gate G1. A second insulating layer 20 may commonly overlap the pixels. The second insulating layer 20 may be an inorganic layer and/or an organic layer and have a single-layered or multilayered structure. The second insulating layer 20 may include at least one of silicon oxide, silicon nitride, or silicon oxynitride. According to some example embodiments, the second insulating layer 20 may have a multilayer structure including a silicon oxide layer and a silicon nitride layer.

A third insulating layer 30 may be located on the second insulating layer 20. The third insulating layer 30 may has a single layer or multilayer structure. For example, the third insulating layer 30 may have a multilayer structure including a silicon oxide layer and a silicon nitride layer.

A first connection electrode CNE1 may be located on the third insulating layer 30. The first connection electrode CNE1 may be connected to the signal line SCL through a contact hole CNT-1 passing through the first to third insulating layers 10 to 30.

A fourth insulating layer 40 may be located on the third insulating layer 30. The fourth insulating layer 40 may be a single-layered silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be located on the fifth insulating layer 50 to cover the second connection electrode CNE2. The sixth insulating layer 60 may be an organic layer.

A light emitting element layer 130 may be located on the circuit layer 120. The light emitting element layer 130 may include a light emitting element 100PE. For example, the light emitting element layer 130 may include an organic light emitting material, quantum dots, quantum rods, a micro LED, or a nano LED. Hereinafter, the light emitting device 100PE is described as an example of an organic light emitting element, but is not particularly limited thereto.

The light emitting element 100PE may include a first electrode AE, an emission layer EL, and a second electrode CE. The first electrode AE may be located on the sixth insulating layer 60. The first electrode AE may be connected to the second connection electrode CNE2 through a contact hole CNT-3 passing through the sixth insulating layer 60.

A pixel defining layer 70 may be located on the sixth insulating layer 60 to cover a portion of the first electrode AE. An opening 70-OP is defined in the pixel defining layer 70. The opening 70-OP of the pixel defining layer 70 exposes at least a portion of the first electrode AE.

The active area 1000A (see FIG. 1) may include an emission area PXA and a non-emission area NPXA adjacent to the emission area PXA. A non-emission area NPXA may surround the emission area PXA. According to some embodiments, an emission area PXA may be defined to correspond to a portion of an area of the first electrode AE, which is exposed by the opening 70-OP.

The emission layer EL may be located on the first electrode AE. The emission layer EL may be located on an area corresponding to the opening 70-OP. That is, the emission layer EL may be arranged to be separated from each of the pixels. When the emission layer EL is arranged to be separated from each of the pixels, each of the emission layers EL may emit light having at least one of blue, red, or green color. However, the embodiments of the inventive concept are not limited thereto. For example, the emission layer EL may be commonly provided to be connected to the pixels. In this case, the emission layer EL may provide blue light or white light.

The second electrode CE may be located on the emission layer EL. The second electrode CE may have an integrated shape and is commonly arranged on the plurality of pixels.

According to some example embodiments, a hole control layer may be located between the first electrode AE and the emission layer EL. The hole control layer may be commonly arranged on the emission area PXA and the non-emission area NPXA. The hole control layer may include a hole transport layer and may further include a hole injection layer. An electron control layer may be located between the emission layer EL and the second electrode CE. The electron control layer may include an electron transport layer and may further include an electron injection layer. The hole control layer and the electron control layer may be commonly formed in the plurality of pixels by using an open mask.

An encapsulation layer 140 may be located on the light emitting element layer 130. The encapsulation layer 140 may include an inorganic layer, an organic layers, and an inorganic layer, which are sequentially laminated, but layers constituting the encapsulation layer 140 are not limited thereto.

The inorganic layers may protect the light emitting element layer 130 against moisture and oxygen, and the organic layer may protect the light emitting element layer 130 against foreign substances such as dust particles. The inorganic layers may include a silicon nitride layer, a silicon oxy nitride layer, a silicon oxide layer, a titanium oxide layer, or an aluminum oxide layer. The organic layer may include an acrylic-based organic layer, but the embodiments of the inventive concept are not limited thereto.

The sensor layer 200 may be located on the display layer 100 through a continuous process. In this case, the sensor layer 200 may be expressed as being directly arranged on the display layer 100. The direct location may mean that a third component is not located between the sensor layer 200 and the display layer 100. That is, a separate adhesive member may not be located between the sensor layer 200 and the display layer 100. Alternatively, the sensor layer 200 may be bonded to the display layer 110 through an adhesive member. The adhesive member may include a common adhesive or an adhesive agent.

The sensor layer 200 may include a base insulating layer 201, a first conductive layer 202, a sensing insulating layer 203, a second conductive layer 204, and a cover insulating layer 205.

The base insulating layer 201 may be an inorganic layer including at least one of silicon nitride, silicon oxynitride, or silicon oxide. Alternatively, the base insulating layer 201 may be an organic layer including an epoxy resin, an acrylic resin, or an imide-based resin. The base insulating layer 201 may have a single-layered structure or a multilayered structure in which a plurality of layers are laminated in the third direction DR3.

Each of the first conductive layer 202 and the second conductive layer 204 may have a single-layered structure or a multilayered structure in which a plurality of layers are laminated in the third direction DR3.

The conductive layer having the single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), or the like. In addition, the transparent conductive layer may include conductive polymers such as PEDOT, metal nanowires, graphene, and the like.

The conductive layer having the multilayered structure may include metal layers. The metal layers may have a three-layered structure of titanium/aluminum/titanium. The conductive layer having the multilayered structure may include at least one metal layer and at least one transparent conductive layer.

At least one of the sensing insulating layer 203 or the cover insulating layer 205 may include an inorganic layer. The inorganic layer may include at least one of aluminum oxide, titanium oxide, silicon oxide, silicon nitride, silicon oxynitride, zirconium oxide, or hafnium oxide.

At least one of the sensing insulating layer 203 or the cover insulating layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin.

A parasitic capacitance Cb may be generated between the sensor layer 200 and the second electrode CE. As the distance between the sensor layer 200 and the second electrode CE becomes closer, a value of the parasitic capacitance Cb may increase. As the parasitic capacitance Cb increases, a ratio of change in amount of capacitance to the reference value may decrease. The change in capacitance may mean a change in capacitance that occurs before and after an input by the input unit, for example, the input device 2000 (see FIG. 3) or the user's body 3000 (see FIG. 3).

The sensor controller 200C (see FIG. 3) processing the signal sensed from the sensor layer 200 may perform a leveling operation of removing a value corresponding to the parasitic capacitance Cb from the sensed signal. The ratio of change in amount of capacitance to the reference value may increase to sensing sensitivity by the leveling operation.

Figure 6:
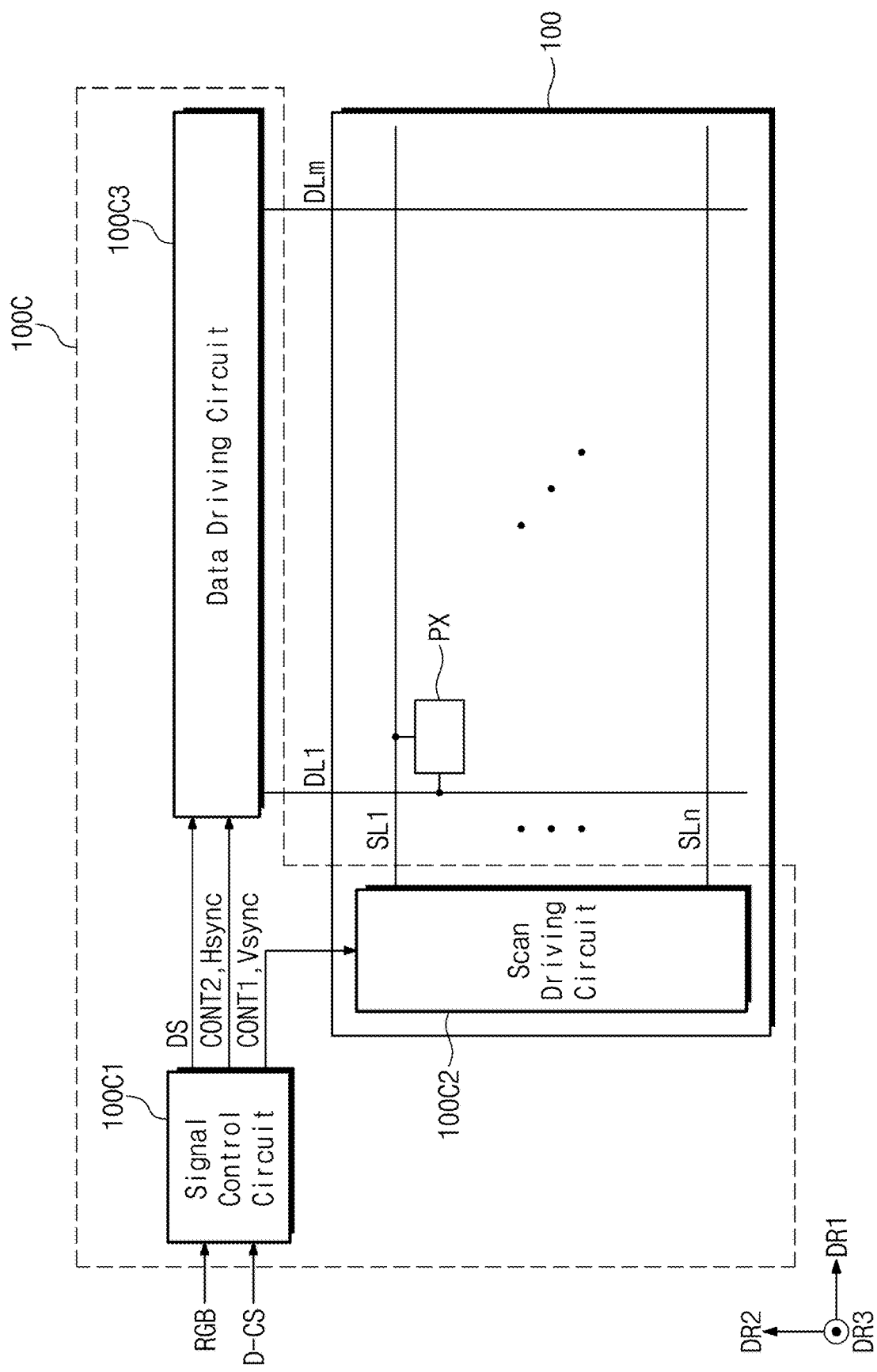
FIG. 6 is a block diagram of a display layer and a display controller according to some embodiments of the inventive concept.

FIG. 6 is a block diagram of the display layer and the display controller according to some embodiments of the inventive concept.

Referring to FIG. 6, the display layer 100 may include a plurality of scan lines SL1 to SLn, a plurality of data lines DL1 to DLm, and a plurality of pixels PX. Each of the plurality of pixels PX may be connected to a corresponding data line of the plurality of data lines DL1 to DLm and may be connected to a corresponding scan line of the plurality of scan lines SL1 to SLn. According to some embodiments of the inventive concept, the display layer 100 may further include emission control lines, and the display controller 100C may further include an emission driving circuit that provides control signals to the emission control lines. A configuration of the display layer 100 is not particularly limited.

The display controller 100C may include a signal control circuit 100C1, a scan driving circuit 100C2, and a data driving circuit 100C3.

The signal control circuit 100C1 may receive image data RGB and a control signal D-CS from the main controller 1000C (see FIG. 3). The control signal D-CS may include various signals. For example, the control signal D-CS may include an input vertical synchronization signal, an input horizontal synchronization signal, a main clock, and a data enable signal.

The signal control circuit 100C1 may generate a first control signal CONT1 and a vertical synchronization signal Vsync based on the control signal D-CS to output the first control signal CONT1 and the vertical synchronization signal Vsync to the scan driving circuit 100C2. The vertical synchronization signal Vsync may be included in the first control signal CONT1.

The signal control circuit 100C1 may generate a second control signal CONT2 and a horizontal synchronization signal Hsync based on the control signal D-CS to output the second control signal CONT2 and the horizontal synchronization signal Hsync to the data driving circuit 100C3. The horizontal synchronization signal Hsync may be included in the second control signal CONT2.

Also, the signal control circuit 100C1 may output a data signal DS obtained by processing the image data RGB according to an operating condition of the display layer 100 to the data driving circuit 100C3. The first control signal CONT1 and the second control signal CONT2 may be signals required for the operations of the scan driving circuit 100C2 and the data driving circuit 100C3 and also are not particularly limited.

The scan driving circuit 100C2 may drive the plurality of scan lines SL1 to SLn in response to the first control signal CONT1 and the vertical synchronization signal Vsync. According to some embodiments of the inventive concept, the scan driving circuit 100C2 may be formed through the same process as the circuit layer 120 (see FIG. 5) in the display layer 100, but is not limited thereto. For example, the scan driving circuit 100C2 may be implemented as an integrated circuit (IC) and thus be directly mounted on an area (e.g., a set or predetermined area) of the display layer 100 or be mounted on a separate printed circuit board in a chip on film (COF) manner so as to be electrically connected to the display layer 100.

The data driving circuit 100C3 may output gradation voltages for driving the plurality of data lines DL1 to DLm in response to the second control signal CONT2, the horizontal synchronization signal Hsync, and the data signal DS from the signal control circuit 100C1. The data driving circuit 100C3 may be implemented as an integrated circuit and thus be directly mounted on an area (e.g., a set or predetermined area) of the display layer 100 or be mounted on a separate printed circuit board in a chip on film manner so as to be electrically connected to the display layer 100, but is not particularly limited thereto. For example, the data driving circuit 100C3 may be formed through the same process as the circuit layer 120 (see FIG. 5) in the display layer 100.

Figure 7:
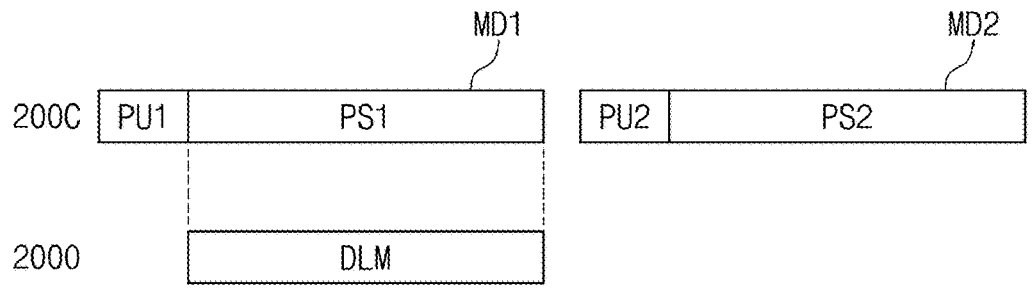
FIG. 7 is a conceptual view illustrating operations of a first mode and a second mode according to some embodiments of the inventive concept.

FIG. 7 is a conceptual view illustrating operations of the first mode and the second mode according to some embodiments of the inventive concept.

Referring to FIGS. 3 and 7, the sensor controller 200C may operate in a first mode MD1 in which the first input by the input device 2000 is sensed or a second mode MD2 in which the second input by the user's body 3000 is sensed.

The first mode MD1 may include a first section PU1 and a second section PS1. The second section PS1 may proceed after the first section PU1. In the first section PU1, the uplink signal ULS or the reverse-phase signal having a reverse phase of the uplink signal ULS may be transmitted to the sensor layer 200. The reverse-phase signal will be described in more detail below. In the second section PS1, the downlink signal DLS provided from the input device 2000 may be inputted through the sensor layer 200. The sensor layer 200 may sense a first input of the input device 2000 based on the downlink signal DLS.

The input device 2000 may provide the downlink signal DLS to the sensor controller 200C during a downlink operation period DLM.

The sensor controller 200C may operate in the second mode MD2 after the first mode MD1 is ended. The first mode MD1 and the second mode MD2 may be repeated with each other.

The second mode MD2 may include a first section PU2 and a second section PS2. The second section PS2 may proceed after the first section PU2. In the first section PU2, the uplink signal ULS or the reverse-phase signal may be transmitted to the sensor layer 200. The second section PS2 may be a section in which the second input by the user's body 3000 is sensed.

The input device 2000 may provide a response signal to the uplink signal ULS to the sensor layer 200. When the sensor controller 200C receives the response signal sensed by the sensor layer 200 in the first sections PU1 and PU2, the sensor controller 200C may operate as the second section PS1 of the first mode MD1. When the sensor controller 200C does not receive the response signal from the input device 2000 in the first section PU2, the sensor controller 200C may operate as the second section PS2 of the second mode MD2. Thus, the sensor layer 200 may periodically monitor whether the input device 2000 is sensed to easily sense the first input by the input device 2000. However, this is merely an example, and thus, the operation of the sensor controller 200C is not particularly limited.

Figure 8:
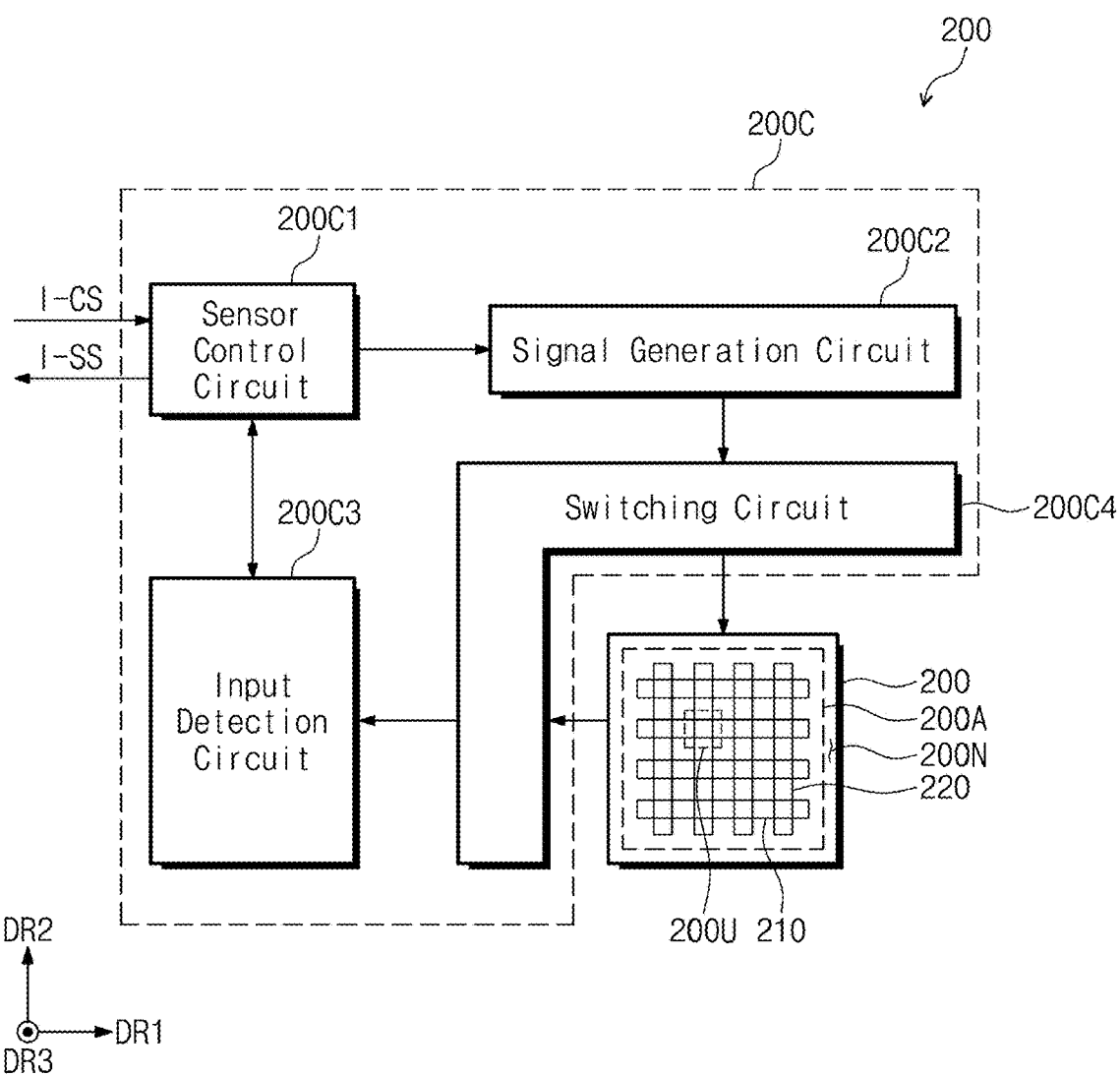
FIG. 8 is a block diagram of a sensor layer and a sensor controller according to some embodiments of the inventive concept.

FIG. 8 is a block diagram of the sensor layer and the sensor controller according to some embodiments of the inventive concept.

Referring to FIG. 8, an active area 200A and a peripheral area 200N may be defined on the sensor layer 200. The active area 200A may be an area that is activated according to an electrical signal. For example, the active area 200A may be an area that senses an input. The active area 200A may overlap the active area 1000A (see FIG. 1) of the electronic device 1000 (see FIG. 1). The peripheral area 200N may surround the active area 200A. The peripheral area 200N may overlap the peripheral area 1000NA (see FIG. 1) of the electronic device 1000 (see FIG. 1).

The sensor layer 200 may include a plurality of electrodes 210 and a plurality of cross electrodes 220. Each of the plurality of electrodes 210 may extend in the first direction DR1, and the plurality of electrodes 210 may be arranged to be spaced apart from each other in the second direction DR2. Each of the plurality of cross electrodes 220 may extend in the second direction DR2, and the plurality of cross electrodes 220 may be arranged to be spaced apart from each other in the first direction DR1.

The plurality of cross electrodes 220 may insulately cross the plurality of electrodes 210. The term "insulately" refers to the cross electrodes 220 crossing the plurality of electrodes 210 (e.g., in a plan view) without being electrically connected to the plurality of electrodes 210, such that the cross electrodes 220 are insulated from the electrodes 210 when they cross or intersect (e.g., from a plan view). Each of the plurality of electrodes 210 and the plurality of cross electrodes 220 may have a bar shape or a stripe shape. The plurality of electrodes 210 and the plurality of cross electrodes 220 having the above-described shape may improve sensing characteristics of a continuous linear input. However, the shape of each of the plurality of electrodes 210 and the plurality of cross electrodes 220 is not limited thereto.

The sensor controller 200C may receive the control signal I-CS from the main controller 1000C (see FIG. 3) and provide the coordinate signal I-SS to the main controller 1000C (see FIG. 3). The sensor controller 200C may be referred to as the controller 200C.

The sensor controller 200C may include a sensor control circuit 200C1, a signal generation circuit 200C2, an input detection circuit 200C3, and a switching circuit 200C4. The sensor control circuit 200C1, the signal generation circuit 200C2, and the input detection circuit 200C3 may be implemented in a single chip, or some and others of the sensor control circuit 200C1, the signal generation circuit 200C2, and the input detection circuit 200C3 may be implemented in different chips.

The sensor control circuit 200C1 may control operations of the signal generation circuit 200C2 and the switching circuit 200C4, calculate coordinates of an external input from the driving signal received from the input detection circuit 200C3, or analyze information, which is transmitted from the input device 2000 (see FIG. 3), from a modulated signal received from the input detection circuit 200C3. The sensor control circuit 200C1 may define the active area 200A of the sensor layer 200 as a plurality of areas. The sensor control circuit 200C1 may provide the uplink signal ULS (see FIG. 3) in some of the plurality of areas and may provide the reverse-phase signal having the reverse phase of the uplink signal ULS (see FIG. 3) in the rest of the areas. This will be described later.

The signal generation circuit 200C2 may provide an output signal (or driving signal), which is referred to as a TX signal, to the sensor layer 200. The signal generation circuit 200C2 may output an output signal corresponding to the operation mode to the sensor layer 200.

The input detection circuit 200C3 may convert an analog signal, which is received from the sensor layer 20 and referred to as an RX signal (or sensing signal), into a digital signal. The input detection circuit 200C3 may amplify and filter the received analog signal. Then, the input detection circuit 200C3 may convert the filtered signal into the digital signal.

The switching circuit 200C4 may selectively control an electrical connection relationship between the sensor layer 200 and the signal generation circuit 200C2 and/or the input detection circuit 200C3 under the control of the sensor control circuit 200C1. The switching circuit 200C4 may connect any one group of the plurality of electrodes 210 and the plurality of cross electrodes 220 to the signal generation circuit 200C2 according to the control of the sensor control circuit 200C1 or connect each of the plurality of electrodes 210 and the plurality of cross electrodes 220 the signal generation circuit 200C2. Alternatively, the switching circuit 200C4 may connect one group or all of the plurality of electrodes 210 and the plurality of cross electrodes 220 to the input detection circuit 200C3.

Figure 9A:
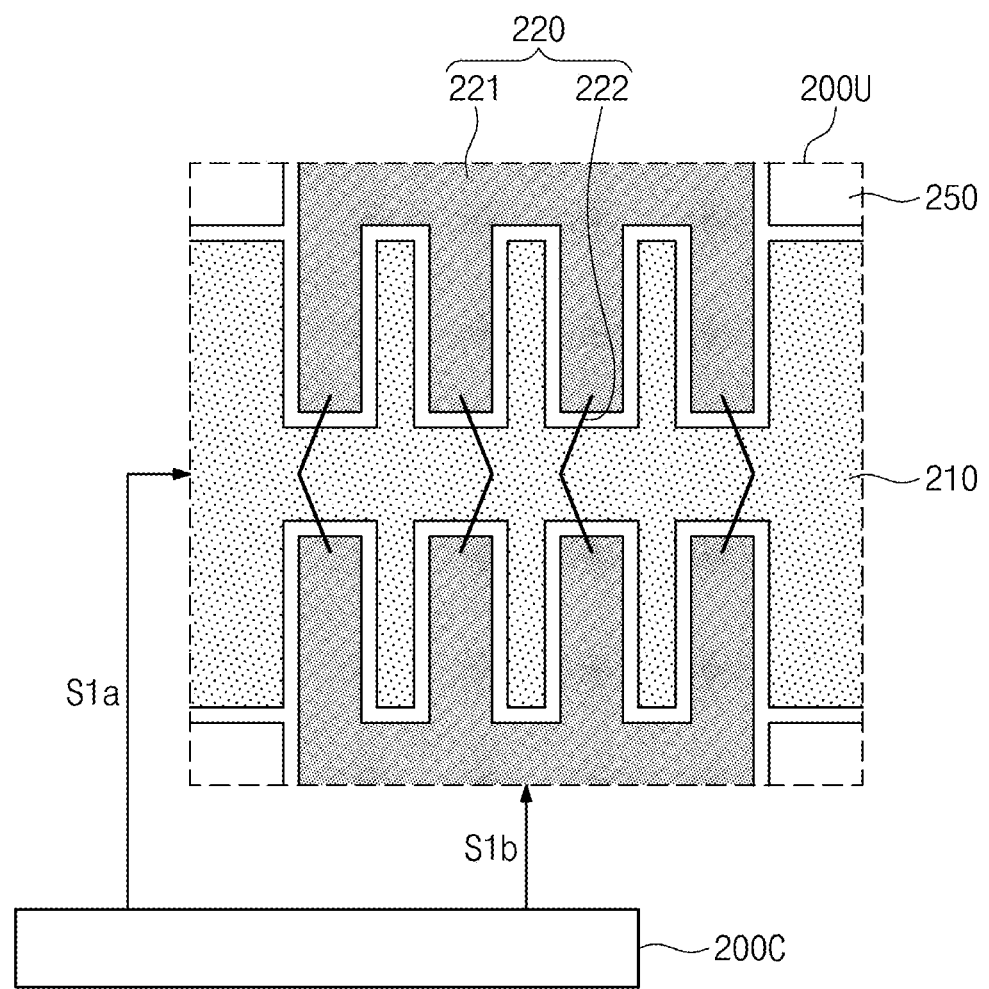
FIGS. 9A and 9B are views of the sensor layer that operates in the first mode according to some embodiments of the inventive concept.
Figure 9B:
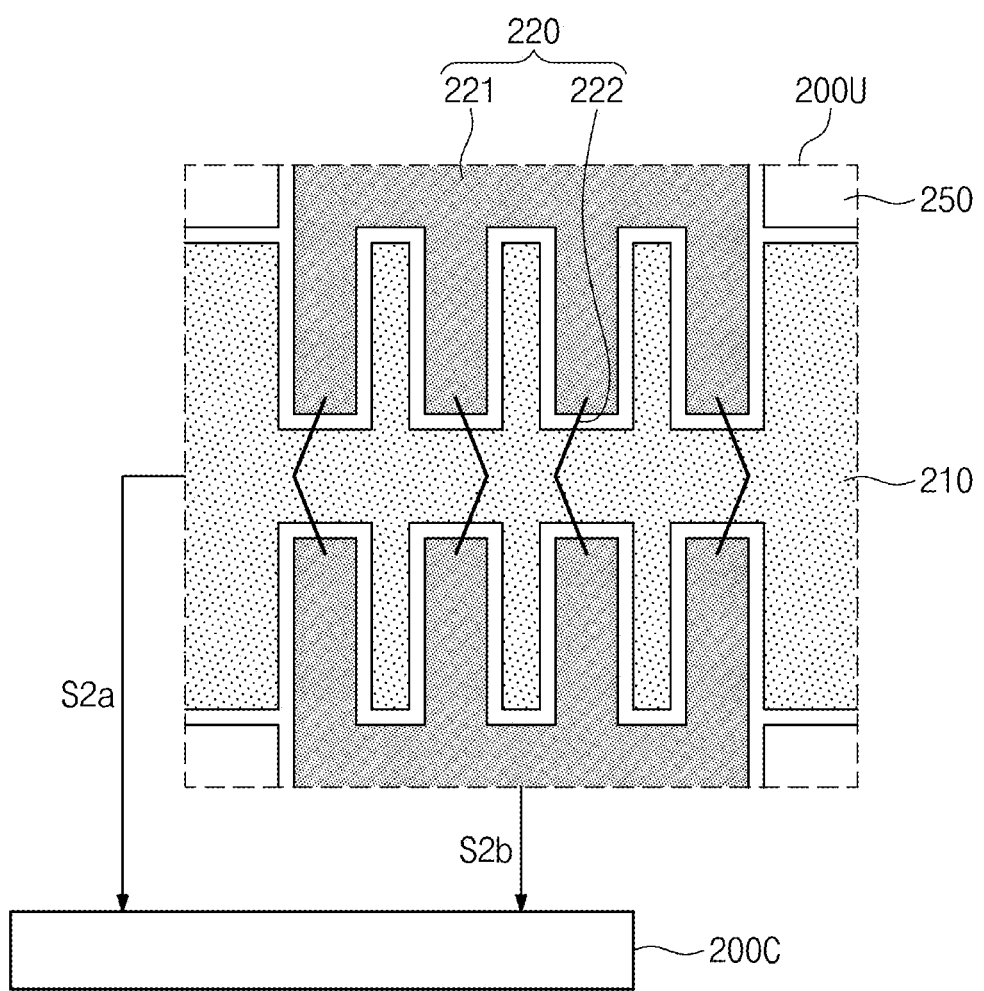

FIGS. 9A and 9B are views of the sensor layer that operates in the first mode according to some embodiments of the inventive concept.

Referring to FIGS. 8, 9A, and 9B, a portion of one electrode 210 and a portion of one cross electrode 220 may be defined as one sensing unit 200U. In each of FIGS. 9A and 9B, one sensing unit 200U is enlarged and illustrated.

The cross electrode 220 may include cross patterns 221 and bridge patterns 222 electrically connected to the cross patterns 221. The cross patterns 221 may be spaced apart from each other with the electrode 210 therebetween. The bridge patterns 222 may overlap the electrode 210, and the bridge patterns 222 may insulately cross the electrode 210. The term "insulately" refers to the bridge patterns 222 crossing or intersecting the electrode 210 from a plan view without being electrically connected to the electrode 210, such that the bridge patterns are insulated from the electrode 210.

The cross patterns 221 and the electrode 210 may be located on the same layer, and the bridge patterns 222 may be located on a layer different from the cross patterns 221 and the electrode 210. For example, the cross patterns 221 and the electrode 210 may be included in the second conductive layer 204 (see FIG. 5), and the bridge patterns 222 may be included in the first conductive layer 202 (see FIG. 5). This structure may be referred to as a bottom bridge structure. However, the embodiments of the inventive concept are not particularly limited thereto. For example, the cross patterns 221 and the electrode 210 may be included in the first conductive layer 202 (see FIG. 5), and the bridge patterns 222 may be included in the second conductive layer 204 (see FIG. 5). This structure may be referred to as a top bridge structure.

Also, the sensor layer 200 may further include a dummy pattern 250 located on an area on which the cross patterns 221 and the electrode 210 are not located. The dummy pattern 250 may be configured to prevent the electrode 210 and the cross electrode 220 from being visually recognized from the outside, and the dummy pattern 250 may be an electrically floated pattern.

Each of the cross patterns 221, the electrode 210, and the dummy pattern 250 may have a mesh structure. In this case, an opening may be defined in each of the cross patterns 221, the electrode 210, and the dummy pattern 250. However, the embodiments of the inventive concept are not limited thereto. For example, each of the cross pattern 221, the electrode 210, and the dummy pattern 250 may be provided as a transparent conductive electrode.

The first mode MD1 (see FIG. 7) may be a mode in which the electronic device 1000 (see FIG. 1) and the input device 2000 (see FIG. 1) transmit and receive data therebetween. The operation illustrated in FIG. 9A may be an operation of providing the uplink signal from the electronic device 1000 (see FIG. 1) to the input device 2000 (see FIG. 1).

Referring to FIG. 9A, an example in which each of the electrode 210 and the cross electrode 220 is utilized as a transmission electrode for providing uplink signals S1a and S1b provided from the sensor controller 200C to the input device 2000 (see FIG. 1), not is not particularly limited thereto. For example, the electrode 210 or the cross electrode 220 may be used as a transmission electrode.

Referring to FIG. 9B, each of the electrode 210 and the cross electrode 220 may be utilized as a reception electrode for transmitting sensing signals S2a and S2b induced from the input device 2000 (see FIG. 1) to the sensor controller 200C. The sensor controller 200C may receive a first sensing signal S2a from the electrode 210 and receive a second detection signal S2b from the cross electrode 220.

Figure 10:
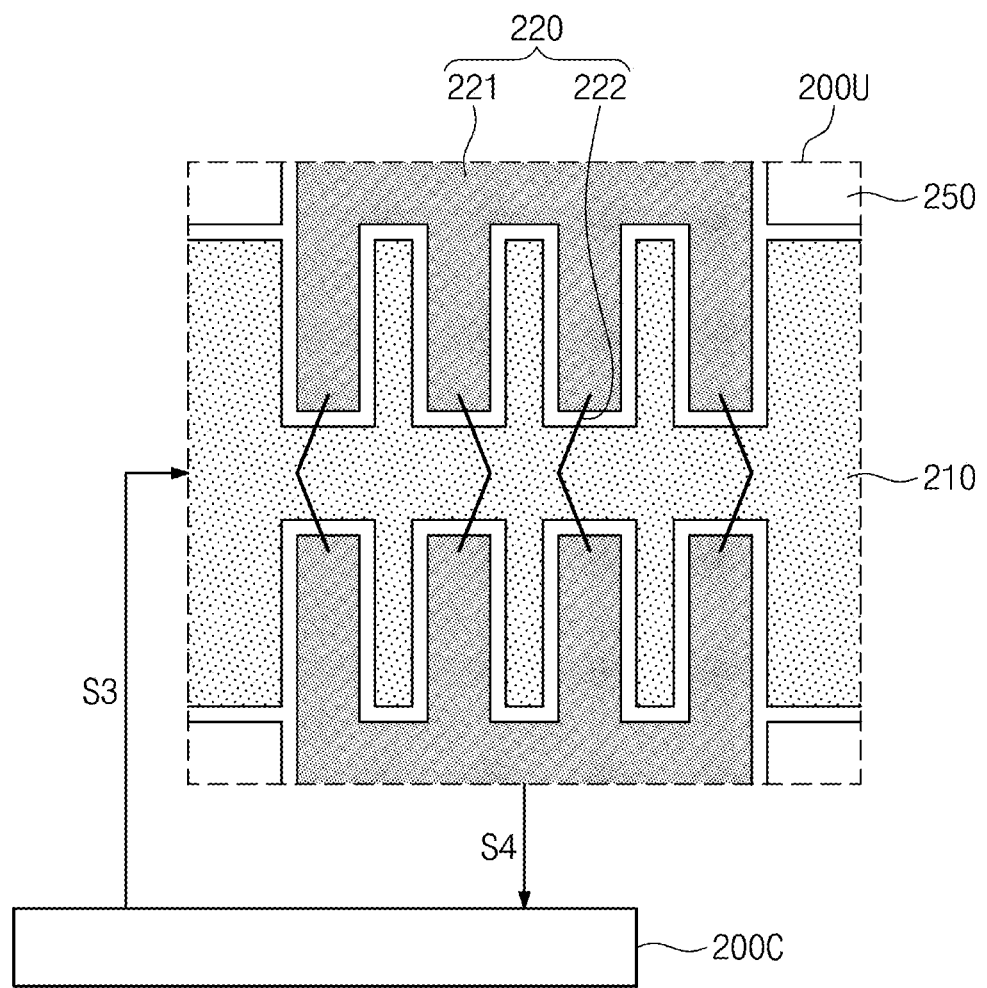
FIG. 10 is a view of the sensor layer that operates in the second mode according to some embodiments of the inventive concept.

FIG. 10 is a view of the sensor layer that operates in the second mode according to some embodiments of the inventive concept.

Referring to FIGS. 8 and 10, in the second mode MD2 (see FIG. 7), the sensor controller 200C may sense the second input by the user's body 3000 (see FIG. 3). In the second mode MD2 (see FIG. 7), the sensor controller 200C may sense an external input by sensing a change in mutual capacitance generated between the electrode 210 and the cross electrode 220.

The sensor controller 200C may provide an output signal S3 to the electrode 210, and the sensor controller 200C may receive a sensing signal S4 from the cross electrode 220. That is, in the second mode MD2 (see FIG. 7), the electrode 210 may function as the transmission electrode, and the cross electrode 220 may function as the reception electrode. However, the embodiments of the inventive concept are not particularly limited thereto. For example, the electrode 210 may function as the reception electrode, and the cross electrode 220 may function as the transmission electrode.

Figure 11A:
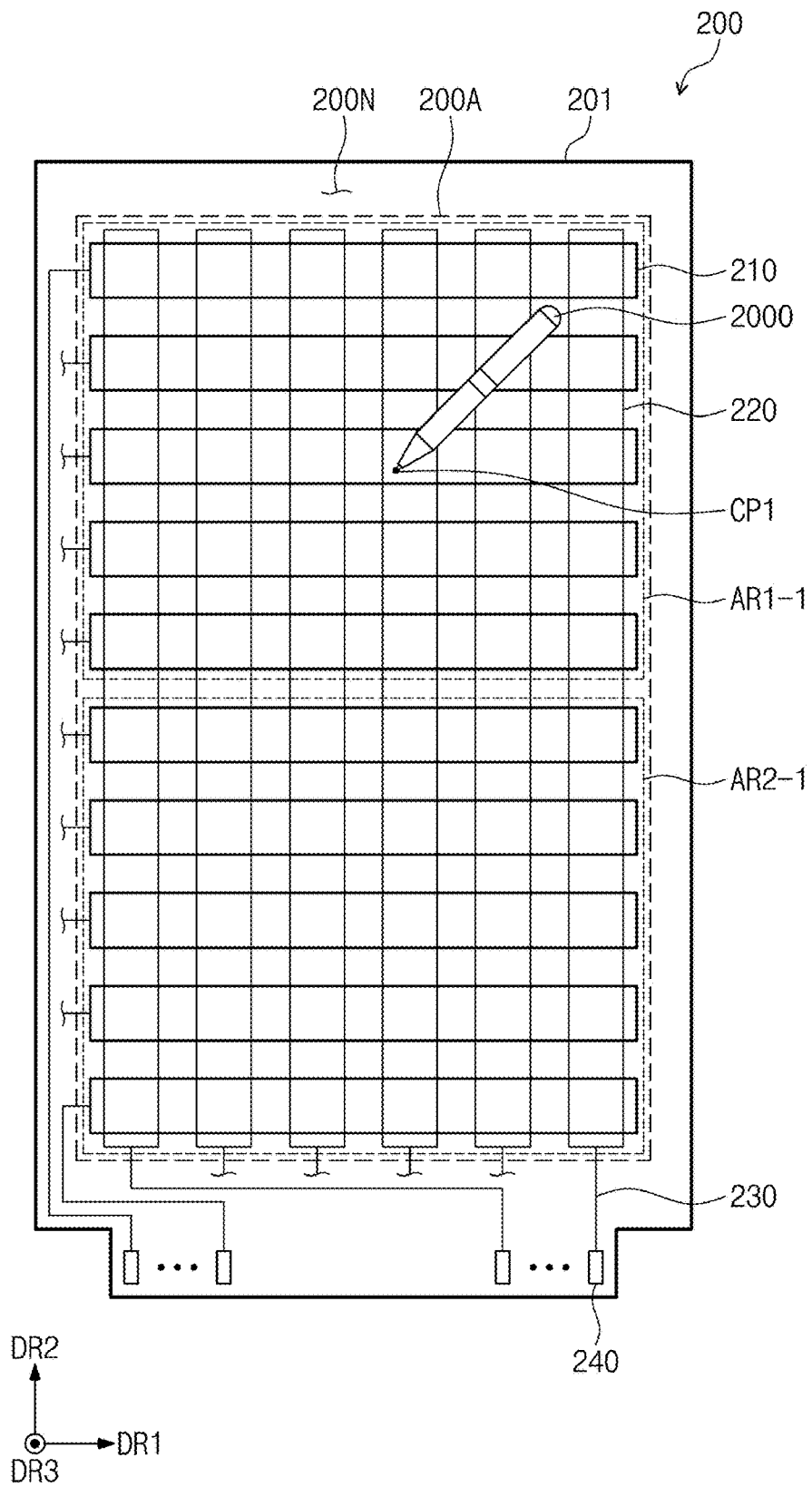
FIGS. 11A and 11B are plan views of the sensor layer in the first mode according to some embodiments of the inventive concept.
Figure 11B:
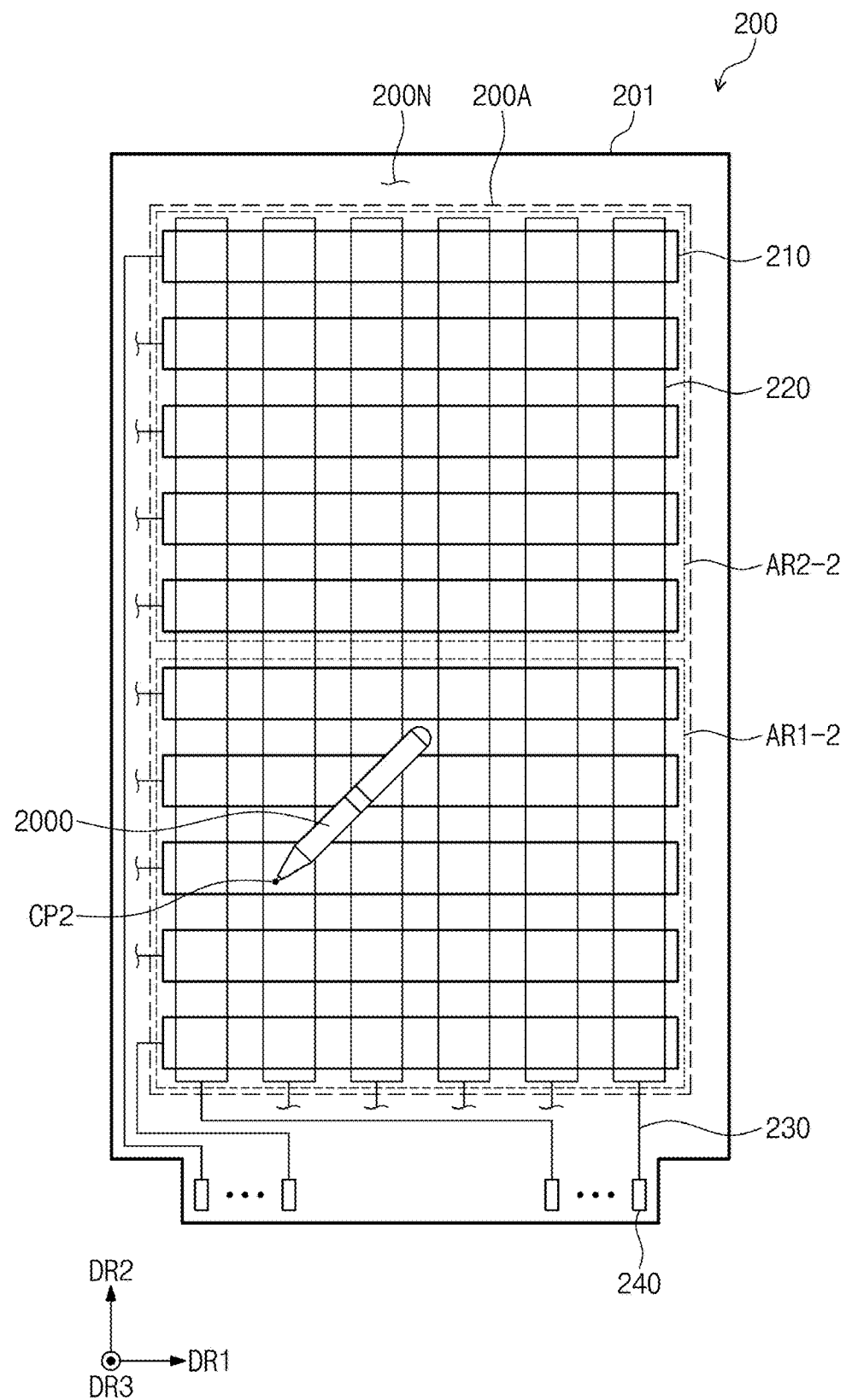
Figure 12:
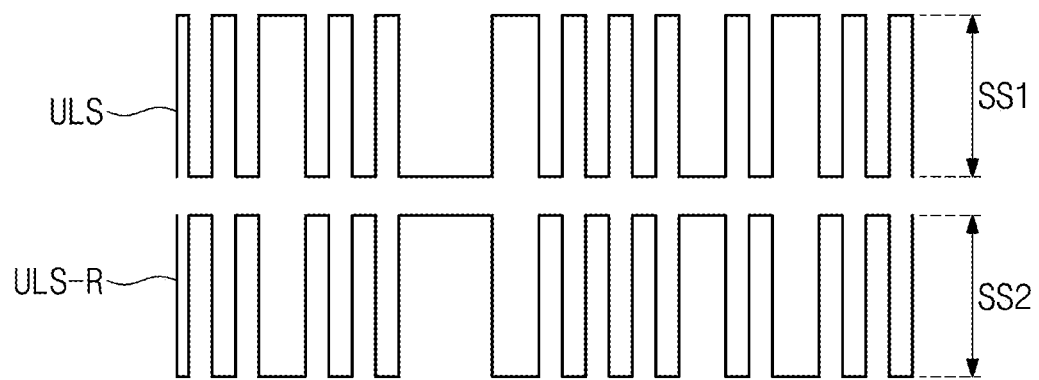
FIG. 12 is a view of an uplink signal and a reverse-phase signal according to some embodiments of the inventive concept.

FIGS. 11A and 11B are plan views of the sensor layer in the first mode according to some embodiments of the inventive concept, and FIG. 12 is a view of the uplink signal and the reverse-phase signal according to some embodiments of the inventive concept.

Referring to FIGS. 8 and 11A to 12, the sensor layer 200 may include a base insulating layer 201, a plurality of electrodes 210, a plurality of cross electrodes 220, a plurality of lines 230, and a plurality of pads 240.

The plurality of electrodes 210 and the plurality of cross electrodes 220 may be located on the active area 200A. The plurality of lines 230 and the plurality of pads 240 may be located on the peripheral area 200N.

Each of the plurality of electrodes 210 and the plurality of cross electrodes 220 may be electrically connected to a corresponding line of the plurality of lines 230. A single routing structure in which one line 230 is connected to one electrode 210 and one line 230 is connected to one cross electrode 220 is illustrated in FIGS. 11A and 11B as an example, but is not limited thereto. For example, two lines 230 may be connected to each of the plurality of cross electrodes 220. Alternatively, two lines 230 may be connected to each of the plurality of electrodes 210, and two lines 230 may be connected to each of the plurality of cross electrodes 220.

The plurality of pads 240 may be electrically connected to the plurality of lines 230, respectively. The sensor layer 200 may be electrically connected to the sensor controller 200C through the plurality of pads 240. However, this is merely an example, and the plurality of pads 240 according to some embodiments of the inventive concept may be located on the display layer 100. In this case, the plurality of lines 230 may be electrically connected to the plurality of pads 240 through contact holes.

The sensor controller 200C may generate a reverse-phase signal ULS-R having a reverse phase of the uplink signal ULS. The reverse-phase signal ULS-R may have a phase difference of about 180 degrees with respect to the uplink signal ULS. An intensity SS2 of the reverse-phase signal ULS-R may be the same as that SS1 of the uplink signal ULS. The uplink signal ULS may be the uplink signals S1a and S1b of FIG. 9A.

Referring to FIG. 11A, when the input device 2000 is arranged at a first position in the first mode MD1 (see FIG. 7), the sensor layer 200 may sense a first coordinate CP1. The sensor controller 200C may define a first area AR1-1 based on the first coordinate CP1. The first area AR1-1 may overlap the first coordinate CP1. The first area AR1-1 may be a partial area of the active area 200A. The first area AR1-1 may be defined based on the plurality of electrodes 210. The uplink signal ULS may be provided to the first area AR1-1.

The sensor controller 200C may define a second area AR2-1 different from the first area AR1-1 based on the first area AR1-1. The second area AR2-1 may be adjacent to the first area AR1-1. The second area AR2-1 may not overlap the first area AR1-1. The second area AR2-1 may be the remaining area of the active area 200A. The second area AR2-1 may be defined based on the plurality of electrodes 210. The reverse-phase signal ULS-R may be provided to the second area AR2-1.

FIGS. 11A, 11B, 13 to 15, and 18 illustrate an example in which the uplink signal ULS or the reverse-phase signal ULS-R is transmitted through each of the plurality of electrodes 210. Thus, although the first area AR1-1 and the second area AR2-1 defined based on each of the plurality of electrodes 210 are illustrated, a criteria for defining the plurality of areas according to some embodiments of the inventive concept is not limited thereto. For example, the uplink signal ULS and the reverse-phase signal ULS-R may be transmitted through each of the plurality of cross electrodes 220. In this case, the first area AR1-1 and the second area AR2-1 may be defined based on each of the plurality of cross electrodes 220. Also, the uplink signal ULS and the reverse-phase signal ULS-R may be transmitted through the plurality of electrodes 210 and the plurality of cross electrodes 220. In this case, the first area AR1-1 and the second area AR2-1 may be defined based on the plurality of electrodes 210 and the plurality of cross electrodes 220.

The uplink signal ULS and the reverse-phase signal ULS-R may be transmitted the second electrode CE (see FIG. 5) by the parasitic capacitance Cb (see FIG. 5) generated between the sensor layer 200 and the second electrode CE (see FIG. 5). The uplink signal ULS and the reverse-phase signal ULS-R transmitted to the second electrode CE (see FIG. 5) that are commonly arranged in the plurality of pixels PX (see FIG. 6) in an integrated shape may be offset from each other.

The areas of the first area AR1-1 and the second area AR2-1 may be the same. The intensity SS1 of the uplink signal ULS and the intensity SS2 of the reverse-phase signal ULS-R may be the same. Thus, the uplink signal ULS provided to the first area AR1-1 and the reverse-phase signal ULS-R provided to the second area AR2-1 may be easily offset from each other in the second electrode CE (see FIG. 5).

According to the inventive concept, the uplink signal ULS and the reverse-phase signal ULS-R transmitted to the second electrode CE (see FIG. 5) may be offset from each other to prevent the uplink signal ULS from being transmitted to each of the plurality of data lines DL1 to DLm (see FIG. 6). The data signal DS (see FIG. 6) and the uplink signal (ULS) provided to each of the plurality of data lines DL1 to DLm (see FIG. 6) may be prevented from colliding (or interfere) with each other to prevent the data signal DS (see FIG. 6) from being deformed. Thus, the flicker phenomenon caused by the deformation of the data signal DS (see FIG. 6) by the uplink signal ULS may be removed or reduced to improve image quality.

Referring to FIG. 11B, in the first mode MD1 (see FIG. 7), the input device 2000 may move from a first position to a second position of FIG. 11A. The sensor layer 200 may sense the second coordinate CP2. The sensor controller 200C may define the first area AR1-2 based on the second coordinate CP2. The first area AR1-2 may overlap the second coordinate CP2. The first area may be continuously defined along a moving path of coordinates of the input device 2000, which are sensed by the sensor layer 200. The first area AR1-2 may be defined based on the plurality of electrodes 210. The uplink signal ULS may be provided to the first area AR1-2.

The sensor controller 200C may define a second area AR2-2 different from the first area AR1-2 based on the first area AR1-2. The second area AR2-2 may be adjacent to the first area AR1-2. The second area AR2-2 may not overlap the first area AR1-2. The second area AR2-2 may be defined based on the plurality of electrodes 210. The reverse-phase signal ULS-R may be provided to the second area AR2-2.

According to the inventive concept, the positions of the first areas AR1-1 and AR1-2 may be changed according to the coordinates detected by the input device 2000. The first areas AR1-1 and AR1-2 may provide the uplink signal ULS to the input device 2000. Even if the input device 2000 moves in the first mode MD1 (see FIG. 7), the input device 2000 may receive the uplink signal ULS from the sensor layer 200, and the sensor layer 200 may sense the first input of the input device 2000 Thus, the sensing reliability of the sensor layer 200 may be improved.

Figure 13:
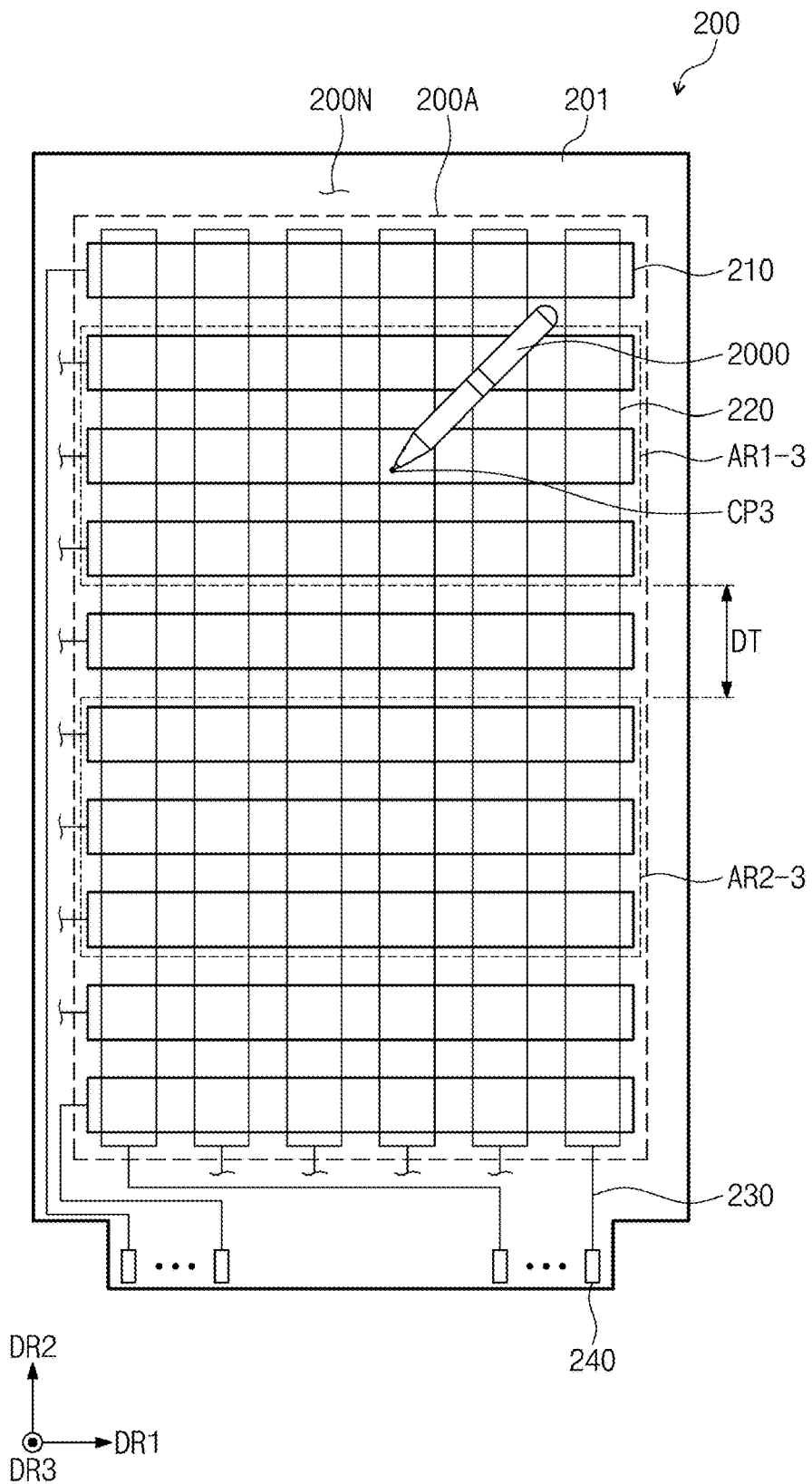
FIGS. 13 to 15 are plan views of the sensor layer in the first mode according to some embodiments of the inventive concept.

FIG. 13 is a plan view of the sensor layer in the first mode according to some embodiments of the inventive concept. In the description of FIG. 13, the same reference numerals are used for the components described through FIGS. 11A and 11B, and descriptions thereof will be omitted.

Referring to FIGS. 8, 12, and 13, in the first mode MD1 (see FIG. 7), the sensor layer 200 may sense the input device 2000 to sense a third coordinate CP3. The sensor controller 200C may define a first area AR1-3 based on the third coordinate CP3. The first area AR1-3 may overlap the third coordinate CP3. The first area AR1-3 may be defined based on the plurality of electrodes 210. The uplink signal ULS may be provided to the first area AR1-3.

The sensor controller 200C may define a second area AR2-3 spaced a distance (e.g., a set or predetermined distance) DT from the first area AR1-3 in the second direction DR2 based on the first area AR1-3. In FIG. 13, the distance (e.g., the set or predetermined distance) DT is illustrated as an interval at which one electrode 210 is located, but embodiments are not particularly limited thereto. The second area AR2-3 may not overlap the first area AR1-3. The second area AR2-3 may be defined based on the plurality of electrodes 210. The reverse-phase signal ULS-R may be provided to the second area AR2-3.

The first area AR1-3 may be defined to be spaced apart a distance (e.g., a set or predetermined distance) DT from the second area AR2-3. The collision (or interference) between the uplink signal ULS and the reverse-phase signal ULS-R received from the sensor layer 200 by the input device 2000 may be prevented. The uplink signal ULS may be prevented from being deformed by the reverse-phase signal ULS-R. Thus, a phenomenon in which the input device 2000 does not receive the uplink signal ULS may be prevented.

The first area AR1-3 and the second area AR2-3 may have the same area. The intensity SS1 of the uplink signal ULS and the intensity SS2 of the reverse-phase signal ULS-R may be the same. Thus, the uplink signal ULS provided to the first area AR1-3 and the reverse-phase signal ULS-R provided to the second area AR2-3 may be easily offset from each other in the second electrode CE (see FIG. 5).

The sum of the area of the first area AR1-3 and the area of the second area AR2-3 may be less than that of the active area 200A. In this case, the electronic device 1000 (see FIG. 1) may reduce power consumption generated when the uplink signal ULS and the reverse-phase signal ULS-R are provided.

According to some embodiments of the inventive concept, the first area AR1-3 may move along coordinates at which the input device 2000 is sensed. The input device 2000 may overlap the electrode 210 to which the uplink signal ULS is provided. In the first mode MD1 (see FIG. 7), the input device 2000 may receive the uplink signal ULS from the sensor layer 200, and the sensor layer 200 may sense the first input of the input device 2000. Thus, the sensing reliability of the sensor layer 200 may be improved.

Figure 14:
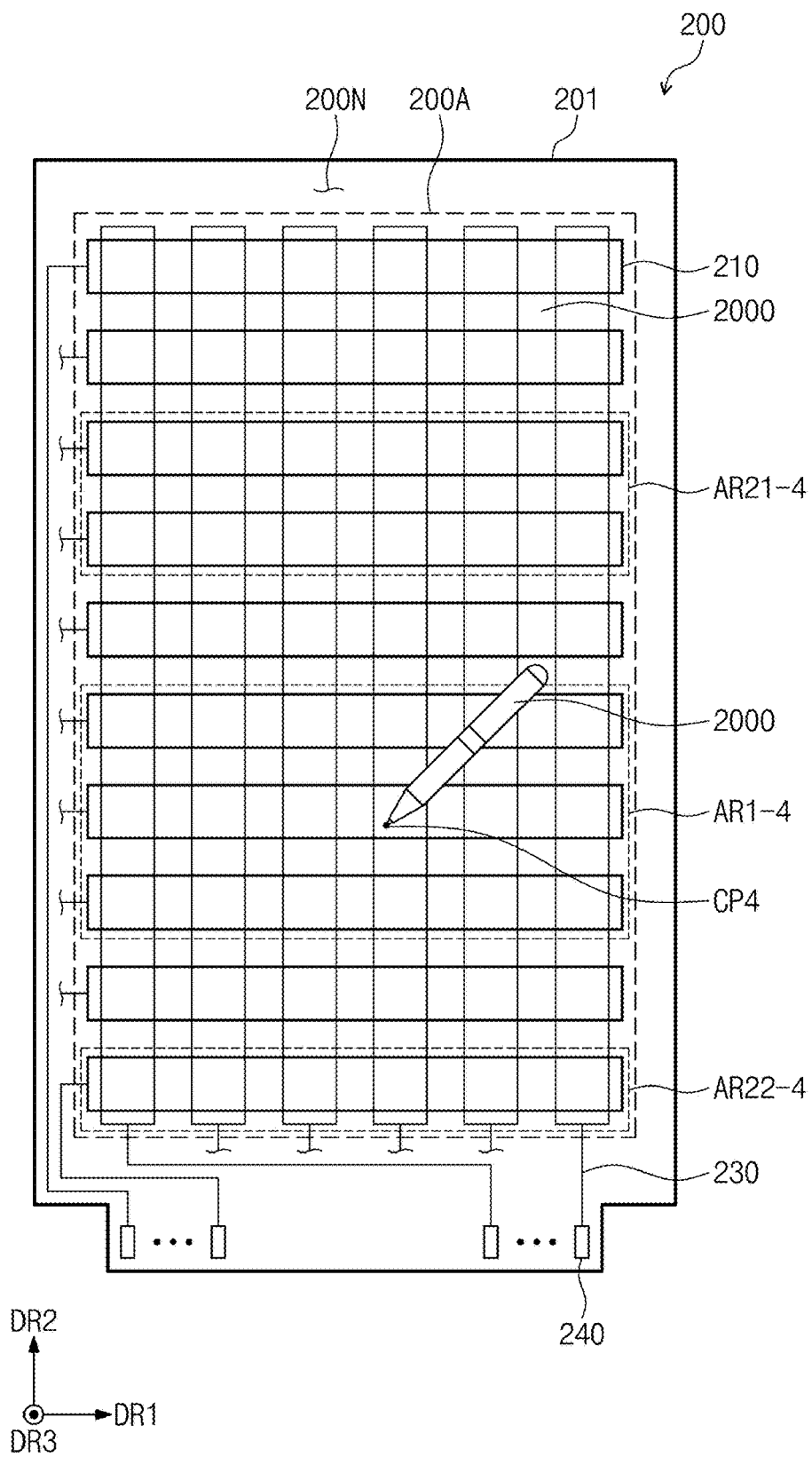

FIG. 14 is a plan view of the sensor layer in the first mode according to some embodiments of the inventive concept. In the description of FIG. 14, the same reference numerals are used for the components described through FIGS. 11A and 11B, and some repetitive descriptions thereof may be omitted.

Referring to FIGS. 8, 12, and 14, in the first mode MD1 (see FIG. 7), the sensor layer 200 may sense the input device 2000 to sense a fourth coordinate CP4. The sensor controller 200C may define the first area AR1-4 based on the fourth coordinate CP4. The first area AR1-4 may overlap the fourth coordinate CP4. The first area AR1-4 may be defined based on the plurality of electrodes 210. The uplink signal ULS may be provided to the first area AR1-4.

The sensor controller 200C may define a plurality of second areas AR21-4 and AR22-4 spaced apart from each other with the first area AR1-4 therebetween based on the first area AR1-4. The plurality of second areas AR21-4 and AR22-4 may not overlap the first area AR1-4. The plurality of second areas AR21-4 and AR22-4 may be defined based on the plurality of electrodes 210. The reverse-phase signal ULS-R may be provided to the plurality of second areas AR21-4 and AR22-4.

An area of the first area AR1-4 may be the same as the sum of the areas of the plurality of second areas AR21-4 and AR22-4. The intensity SS1 of the uplink signal ULS and the intensity SS2 of the reverse-phase signal ULS-R may be the same. Thus, the uplink signal ULS provided to the first area AR1-4 and the reverse-phase signal ULS-R provided to each of the plurality of second areas AR21-4 and AR22-4 may be easily offset from each other in the second electrode CE (see FIG. 5).

According to the inventive concept, the first area AR1-4 may move along coordinates at which the input device 2000 is sensed. The input device 2000 may overlap the electrode 210 to which the uplink signal ULS is provided. In the first mode MD1 (see FIG. 7), the input device 2000 may receive the uplink signal ULS from the sensor layer 200, and the sensor layer 200 may sense the first input of the input device 2000. Thus, the sensing reliability of the sensor layer 200 may be improved.

Figure 15:
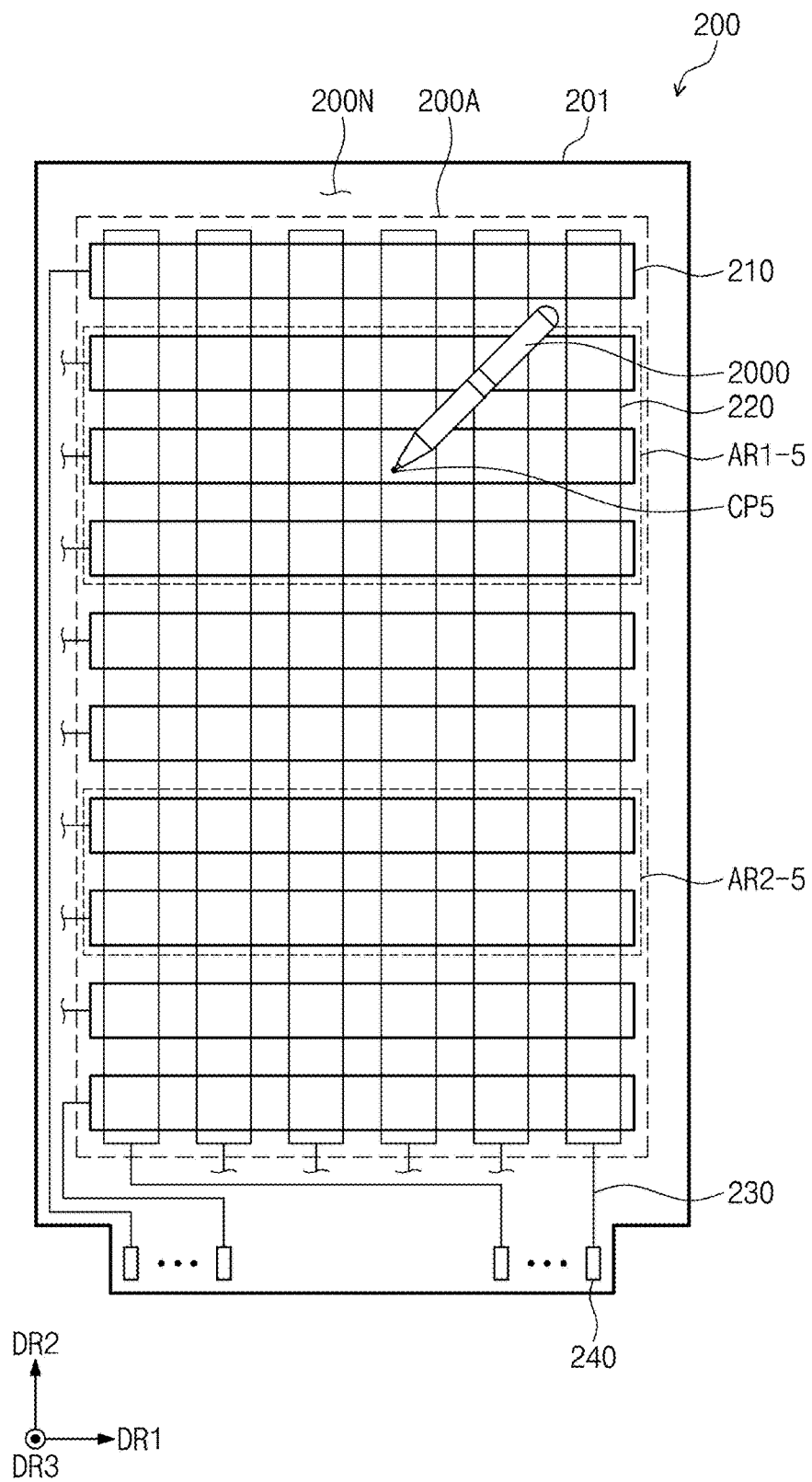

FIG. 15 is a plan view of the sensor layer in the first mode according to some embodiments of the inventive concept. In the description of FIG. 15, the same reference numerals are used for the components described through FIGS. 11A and 11B, and descriptions thereof will be omitted.

Referring to FIGS. 8, 12, and 15, in the first mode MD1 (see FIG. 7), the sensor layer 200 may sense the input device 2000 to sense a fifth coordinate CP5. The sensor controller 200C may define the first area AR1-5 based on the fifth coordinate CP5. The first area AR1-5 may overlap the fifth coordinate CP5. The first area AR1-5 may be defined based on the plurality of electrodes 210. The uplink signal ULS may be provided to the first area AR1-5.

The sensor controller 200C may define a second area AR2-5 different from the first area AR1-5 based on the first area AR1-5. The second area AR2-5 may not overlap the first area AR1-5. The second area AR2-5 may be defined based on the plurality of electrodes 210. The reverse-phase signal ULS-R may be provided to the second area AR2-5.

The area of the first area AR1-5 may be different from that of the second area AR2-5. FIG. 15 illustrates that the area of the first area AR1-5 is greater than that of the second area AR2-5, but the area of each of the first area AR1-5 and the second area AR2-5 according to some embodiments of the inventive concept is not limited thereto. For example, the area of the first area AR1-5 may be less than that of the second area AR2-5.

The sensor controller 200C may control the area of the first area AR1-5 and the area of the second area AR2-5 to control a degree to which the uplink signal ULS and the reverse-phase signal ULS-R are offset from each other in the second electrode CE (see FIG. 5). The data signal DS (see FIG. 6) and the uplink signal ULS may be prevented from colliding (or interfering) with each other, and the data signal DS (see FIG. 6) may be prevented from being deformed by the uplink signal ULS. Thus, the flicker phenomenon may be reduced or removed to improve the image quality.

Figure 16:
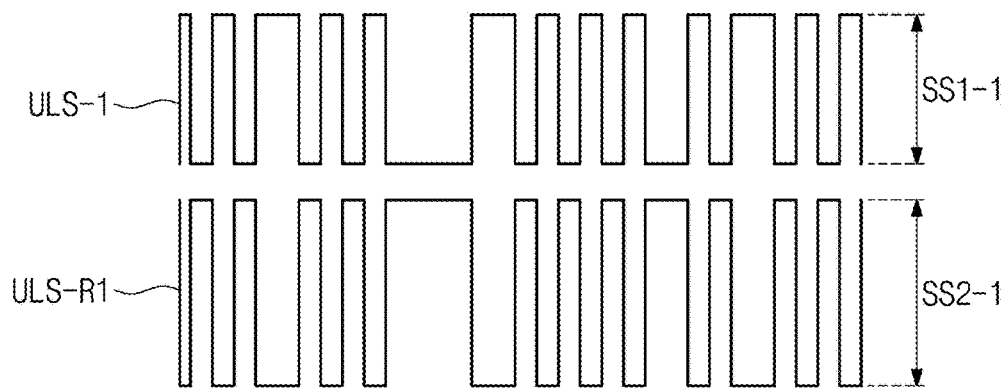
FIG. 16 is a view of an uplink signal and a reverse-phase signal according to some embodiments of the inventive concept.

FIG. 16 is a view of the uplink signal and the reverse-phase signal according to some embodiments of the inventive concept.

Referring to FIGS. 8 and 16, the sensor controller 200C may generate a reverse-phase signal ULS-R1 having a reverse phase of the uplink signal ULS-1. An intensity SS2-1 of the reverse-phase signal ULS-R1 may be different from that SS1-1 of the uplink signal ULS-1. FIG. 16 illustrates that the intensity SS2-1 of the reverse-phase signal ULS-R1 is greater than the intensity SS1-1 of the uplink signal ULS-1, but the intensity SS2-1 of the reverse-phase signal ULS-R1 and the intensity SS2-1 of the uplink signal ULS-1 are not limited thereto. For example, the intensity SS2-1 of the reverse-phase signal ULS-R1 may be less than the intensity SS1-1 of the uplink signal ULS-1.

The sensor controller 200C may control the intensity SS1-1 of the uplink signal ULS-1 and the intensity SS2-1 of the reverse-phase signal ULS-R1 to control a degree to which the uplink signal ULS-1 and the reverse-phase signal ULS-R1 are offset from each other in the second electrode CE (see FIG. 5). The data signal DS (see FIG. 6) and the uplink signal ULS-1 may be prevented from colliding (or interfering) with each other, and the data signal DS (see FIG. 6) may be prevented from being deformed by the uplink signal ULS-1. Thus, the flicker phenomenon may be reduced or removed to improve the image quality.

Figure 17:
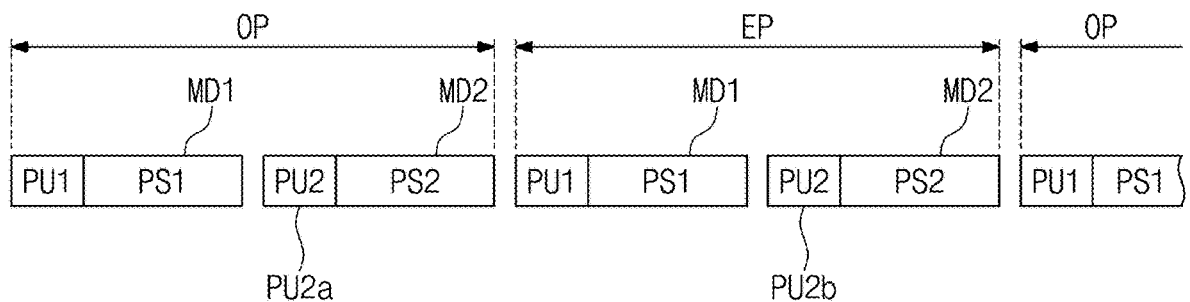
FIG. 17 is a conceptual view illustrating operations of a first mode and a second mode according to some embodiments of the inventive concept.
Figure 18:
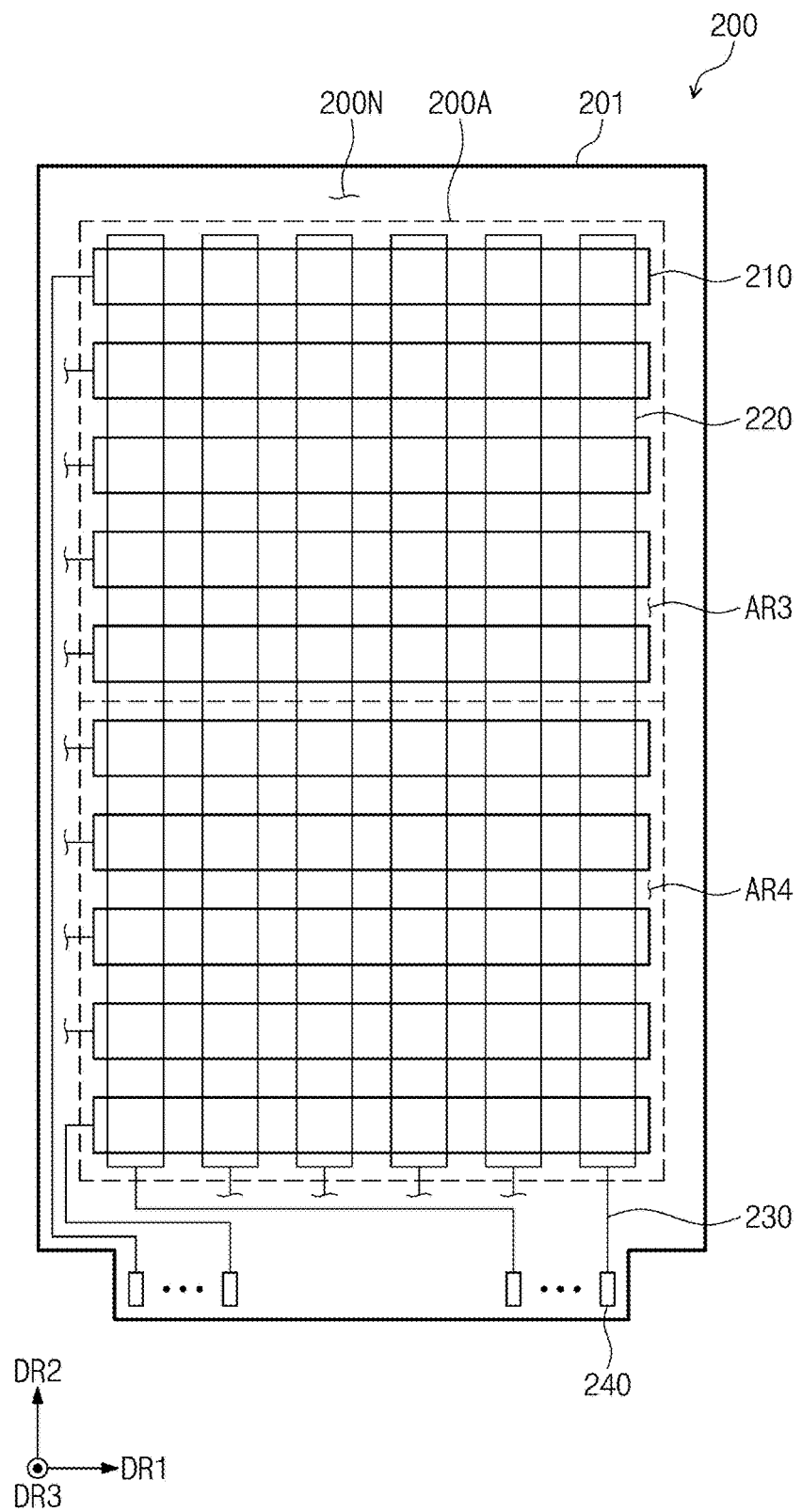
FIG. 18 is a plan view of the sensor layer in the second mode according to some embodiments of the inventive concept.

FIG. 17 is a conceptual view illustrating operations of the first mode and the second mode according to some embodiments of the inventive concept, and FIG. 18 is a plan view of the sensor layer in the second mode according to some embodiments of the inventive concept. In the description of FIG. 18, the same reference numerals are used for the components described through FIGS. 11A and 11B, and descriptions thereof will be omitted.

Referring to FIGS. 8, 17, and 18, the first mode MD1 and the second mode MD2 may be repeated with each other. The sensor controller 200C may control the sensor layer 200 so that the first period OP and the second period EP are repeated. Each of a first period OP and a second period EP may include a first mode MD1 and a second mode MD2. The first period OP may be referred to as a (2n−1)-th period or an odd-numbered period. The second period EP may be referred to as a 2n-th period or an even-numbered period. In this case, n may be a positive integer.

The second mode MD2 may include a first section PU2 and a second section PS2. In the first period OP, the first section PU2 may be defined as an odd-numbered first section PU2a. In the second period EP, the first section PU2 may be defined as an even-numbered first section PU2b.

The sensor controller 200C may provide a first method or a second method different from the first method as a method for reducing or removing the flicker phenomenon in the second mode MD2.

The first method may be a method of applying different signals to each of the odd-numbered first section PU2a and the even-numbered first section PU2b. Hereinafter, the first method will be described.

In the odd-numbered first section PU2a, the uplink signal ULS (see FIG. 12) or the reverse-phase signal ULS-R (see FIG. 12) may be transmitted to the sensor layer 200.

The signal transmitted in the even-numbered first section PU2b may be determined according to the signal transmitted to the sensor layer 200 in the odd-numbered first section PU2a. For example, when the uplink signal ULS (see FIG. 12) may be transmitted to the sensor layer 200 in the odd-numbered first section PU2a, the reverse-phase signal ULS-R may be transmitted to the sensor layer 200 in the even-numbered first section PU2b. When the reverse-phase signal ULS-R (see FIG. 12) is transmitted to the sensor layer 200 in the odd-numbered first section PU2a, the uplink signal ULS (see FIG. 12) may be transmitted to the sensor layer 200 in the even-numbered first section PU2b. Hereinafter, the case in which an uplink signal ULS (see FIG. 12) is transmitted in the odd-numbered first section PU2a, and the reverse-phase signal ULS-R (see FIG. 12) is transmitted in the even-numbered first section PU2b will be described as an example.

During the first period OP in the second mode MD2, the uplink signal ULS (see FIG. 12) may be transmitted to the second electrode CE (see FIG. 5) by the a parasitic capacitance Cb generated between the sensor layer 200 and the second electrode CE (see FIG. 5). The uplink signal ULS (see FIG. 12) transmitted to the second electrode CE (see FIG. 5) may be transmitted to each of the plurality of data lines DL1 to DLm (see FIG. 6) by a parasitic capacitance generated therebetween the second electrode CE (see FIG. 5) and each of the plurality of data lines DL1 to DLm (see FIG. 6).

During the second period EP in the second mode MD2, the reverse-phase signal ULS-R (see FIG. 12) may be transmitted to the second electrode CE (see FIG. 5) by the parasitic capacitance Cb generated between the sensor layer 200 and the second electrode CE (see FIG. 5). The reverse-phase signal ULS-R (see FIG. 12) transmitted to the second electrode CE (see FIG. 5) may be transmitted to each of the plurality of data lines DL1 to DLm (see FIG. 6) by the parasitic capacitance generated therebetween the second electrode CE (see FIG. 5) and each of the plurality of data lines DL1 to DLm (see FIG. 6).

In the second mode MD2, during the first period OP, the data signal DS (see FIG. 6) and the uplink signal ULS (see FIG. 12) may collide (or interfere) with each other to generate a first flicker, and during the second period EP, the data signal DS (see FIG. 6) and the reverse-phase signal ULS-R (see FIG. 12) may collide (or interfere) with each other to generate a second flicker. The first flicker and the second flicker may generate an optical illusion effect in which the first period OP and the second period EP are repeated to be offset from each other. Thus, the image quality may be improved.

The second method may be a method of dividing areas in each of the odd-numbered first section PU2a and the even-numbered first section PU2b to apply different signals to each of the areas. Hereinafter, the second method will be described.

In the second mode MD2 (see FIG. 7), the sensor controller 200C may define the active area 200A into a third area AR3 and a fourth area AR4. The third area AR3 may be a portion of the active area 200A. The fourth area AR4 may be the remaining portion of the active area 200A. The fourth area AR4 may be adjacent to the third area AR3.

The sensor controller 200C may provide the uplink signal ULS (see FIG. 12) or the reverse-phase signal ULS-R (see FIG. 12) to the third area AR3. The sensor controller 200C may determine a signal to be provided to the fourth area AR4 according to a signal provided to the third area AR3. For example, when the uplink signal ULS (see FIG. 12) is provided to the third area AR3, the reverse-phase signal ULS-R (see FIG. 12) may be provided to the fourth area AR4, and when the reverse-phase signal ULS-R (see FIG. 12) is provided to the third area AR3, the uplink signal ULS (see FIG. 12) may be provided to the fourth area AR4.

The sensor controller 200C may provide different signals to the third area AR3 in the odd-numbered first section PU2a and the even-numbered first section PU2b. For example, in the odd-numbered first section PU2a, the sensor controller 200C may provide the uplink signal ULS (see FIG. 12) to the third area AR3 and provide the reverse-phase signal ULS-R (see FIG. 12) to the fourth area AR4. In this case, in the even-numbered first section PU2b, the sensor controller 200C may provide the reverse-phase signal ULS-R (see FIG. 12) to the third area AR3 and provide the uplink signal ULS (see FIG. 12) to the fourth area AR4.

The uplink signal ULS (see FIG. 12) and the reverse-phase signal ULS-R (see FIG. 12) may be transmitted the second electrode CE (see FIG. 5) by the parasitic capacitance Cb (see FIG. 5) generated between the sensor layer 200 and the second electrode CE (see FIG. 5). The uplink signal ULS (see FIG. 12) and the reverse-phase signal ULS-R (see FIG. 12) transmitted to the second electrode CE (see FIG. 5) that are commonly located in the plurality of pixels PX (see FIG. 6) in an integrated shape may be offset from each other.

According to some embodiments of the inventive concept, the uplink signal ULS (see FIG. 12) and the reverse-phase signal ULS-R (see FIG. 12) may be offset from each other in the second electrode CE (see FIG. 5). The uplink signal ULS (see FIG. 12) transmitted to the second electrode CE (see FIG. 5) may be prevented from being transmitted to each of the plurality of data lines DL1 to DLm (see FIG. 6) by the parasitic capacitance generated therebetween the second electrode CE (see FIG. 5) and each of the plurality of data lines DL1 to DLm (see FIG. 6). Therefore, the flicker phenomenon caused by the collision (or interference) between the data signal DS (see FIG. 6) and the uplink signal ULS (see FIG. 12) may be reduced or removed to improve the image quality.

According to the inventive concept, the controller may define the first area and the second area on the basis of the coordinates of the first input, which are sensed by the sensor layer. The controller may provide the uplink signal to the first area and provide the reverse-phase signal to the second area. The uplink signal and the reverse-phase signal, which are transmitted to the second electrode, may be offset from each other by the parasitic capacitance generated between the sensor layer and the second electrode. The uplink signal transmitted to the second electrode may be prevented from being transmitted to each of the plurality of data lines. Thus, the flicker phenomenon caused by the collision (or interference) between the data signal and the uplink signal may be removed or reduced to improve the image quality.

According to some embodiments of the inventive concept, the position of the first area providing the uplink signal to the coordinates of the input device may be changed. Even if the input device moves, the input device may receive the uplink signal from the first area, and the sensor layer may sense the first input of the input device. Therefore, the sensing reliability of the sensor layer may be improved.

It will be apparent to those skilled in the art that various modifications and deviations can be made in the present invention. Thus, it is intended that the present disclosure covers the modifications and deviations of this invention provided they come within the scope of the appended claims and their equivalents. Accordingly, the technical scope of the present invention should not be limited to the contents described in the detailed description of the specification, but should be determined by the claims and their equivalents.

What is claimed is:

1. An electronic device comprising:
a display layer;
a sensor layer on the display layer, the sensor layer having an active area and a peripheral area adjacent to the active area, wherein the sensor layer is configured to operate in a first mode, in which a first input by an input device is sensed, and a second mode, in which a second input by touch is sensed, wherein the sensor layer comprises a cross electrode that insulately crosses an electrode; and
a controller configured to control the sensor layer,
wherein, in the first mode, the controller is configured to define the active area into a first area defined based on coordinates at which the first input by the input device is sensed and a second area different from the first area and defined based on the coordinates, wherein the first area is defined as an area overlapping and adjacent to the coordinates and the second area is defined as an area spaced apart from the coordinates and spaced apart from the first area by a predetermined distance with the cross electrode between the first area and the second area within the predetermined distance, and in the first mode, the controller is configured to provide an uplink signal to the first area and provide a reverse-phase signal having a reverse phase of the uplink signal to the second area, and wherein the uplink signal has an intensity different from that of the reverse-phase signal.

2. The electronic device of claim 1, wherein the first mode comprises a first section in which the uplink signal or the reverse-phase signal is transmitted to the sensor layer and a second section in which the first input is sensed from a downlink signal provided from the input device, and the second section proceeds after the first section.

3. The electronic device of claim 1, wherein the first area is spaced apart from the second area.

4. The electronic device of claim 1, wherein the second area is provided in plurality, and the plurality of second areas are spaced apart from each other with the first area therebetween.

5. The electronic device of claim 1, wherein the first area is different from the second area.

6. The electronic device of claim 1, wherein the coordinate overlaps the first area.

7. The electronic device of claim 1, wherein the second area does not overlap the first area.

8. The electronic device of claim 1, wherein the display layer comprises a light emitting element, the light emitting element comprises a first electrode, a second electrode on the first electrode, and an emission layer between the first electrode and the second electrode, and the uplink signal and the reverse-phase signal are offset from each other in the second electrode.

9. The electronic device of claim 1, wherein the sensor layer is configured to sense the first input through a change in capacitance generated between the input device and the electrode and the cross electrode in the first mode, and the sensor layer is configured to sense a second input through a change in mutual capacitance generated between the electrode and the cross electrode in the second mode.

10. The electronic device of claim 1, wherein the first mode and the second mode are repeated with each other, and in a (2n-1)-th second mode (where n is a positive integer), the controller is configured to provide the uplink signal, and in a 2n-th second mode, the controller is configured to provide the reverse-phase signal.

11. The electronic device of claim 1, wherein, in the second mode, the controller is configured to define the active area into a third area and a fourth area adjacent to the third area, and in the second mode, the controller is configured to provide the uplink signal to the third area and provide the reverse-phase signal to the fourth area.

12. The electronic device of claim 1, wherein the second mode comprises a first section in which the uplink signal or the reverse-phase signal is transmitted to the sensor layer and a second section in which the second input is sensed, and the second section proceeds after the first section.

* * * * *